US012563680B2

(12) United States Patent
Ha

(10) Patent No.: US 12,563,680 B2
(45) Date of Patent: Feb. 24, 2026

(54) DISPLAY APPARATUS

(71) Applicant: Samsung Display Co., Ltd., Yongin-si (KR)

(72) Inventor: Seunghwa Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 62 days.

(21) Appl. No.: 18/467,512

(22) Filed: Sep. 14, 2023

(65) Prior Publication Data

US 2024/0164031 A1 May 16, 2024

(30) Foreign Application Priority Data

Nov. 11, 2022 (KR) ........................ 10-2022-0150624

(51) Int. Cl.
*H05K 5/00* (2025.01)
*H05K 5/02* (2006.01)
(52) U.S. Cl.
CPC ..................................... *H05K 5/02* (2013.01)
(58) Field of Classification Search
CPC . H04M 1/0268; H04M 1/0216; G06F 1/1652; G06F 1/16; G09F 9/30; H10K 50/84; H10K 77/111; H10K 2102/311
See application file for complete search history.

(56) References Cited

U.S. PATENT DOCUMENTS

| | | | | |
|---|---|---|---|---|
| 9,791,892 | B2 * | 10/2017 | Park | G06F 1/1681 |
| 9,844,251 | B2 * | 12/2017 | Lin | G06F 1/1652 |
| 10,191,516 | B2 * | 1/2019 | Jang | G06F 1/1656 |
| 10,209,746 | B2 * | 2/2019 | Baek | G06F 1/1675 |
| 10,261,545 | B2 | 4/2019 | Kim et al. | |
| 10,281,756 | B2 * | 5/2019 | Lin | G02F 1/133308 |
| 10,755,991 | B2 * | 8/2020 | Park | B32B 15/043 |
| 10,877,522 | B2 * | 12/2020 | Jia | H04M 1/0268 |
| 11,119,534 | B2 | 9/2021 | Lee et al. | |
| 11,243,577 | B2 * | 2/2022 | Kim | G06F 1/162 |
| 11,263,930 | B2 * | 3/2022 | Bu | H04M 1/0268 |
| 11,609,612 | B2 * | 3/2023 | Park | G06F 1/1677 |
| 11,612,065 | B2 * | 3/2023 | Wu | H05K 5/0017 |

(Continued)

FOREIGN PATENT DOCUMENTS

| | | |
|---|---|---|
| KR | 10-1292974 B1 | 8/2013 |
| KR | 10-2018-0062273 A | 6/2018 |

(Continued)

*Primary Examiner* — Rockshana D Chowdhury
(74) *Attorney, Agent, or Firm* — Womble Bond Dickinson (US) LLP

(57) ABSTRACT

Provided is a display device including a display panel configured to be folded about a folding axis extending in a first direction, a window above the display panel, an adhesive member between the window and the display panel, a first frame covering an edge of the display panel and an edge of the window, a second frame between the first frame and the window, and a coupling member between the first frame and the second frame, having elasticity, and coupling the first frame to the second frame, wherein the first frame corresponds to a first bezel region in an unfolded state in which the display panel is unfolded, and wherein the first frame and the second frame correspond to a second bezel region, which is different from the first bezel region, in a folded state in which the display panel is folded.

20 Claims, 22 Drawing Sheets

(56)                References Cited

U.S. PATENT DOCUMENTS

| | | | | |
|---|---|---|---|---|
| 11,681,174 | B2 * | 6/2023 | Wang | G02F 1/1333 |
| | | | | 359/483.01 |
| 11,797,055 | B2 * | 10/2023 | Cho | G09F 9/301 |
| 11,805,604 | B2 * | 10/2023 | Lee | G06F 1/1641 |
| 11,846,991 | B2 * | 12/2023 | Feng | G06F 1/1637 |
| 11,996,020 | B2 * | 5/2024 | Tsuchida | G09G 3/035 |
| 12,004,309 | B2 * | 6/2024 | Cho | G06F 3/0443 |
| 12,041,807 | B2 * | 7/2024 | Dong | G06F 1/1637 |
| 12,066,863 | B2 * | 8/2024 | Ran | G06F 1/1679 |
| 12,147,128 | B2 * | 11/2024 | Sun | G06F 1/1656 |
| 12,201,007 | B2 * | 1/2025 | Shi | G06F 1/1652 |
| 12,253,881 | B2 * | 3/2025 | Kim | G06F 1/1656 |
| 12,289,981 | B2 * | 4/2025 | Kim | B32B 15/18 |
| 2009/0295748 | A1 * | 12/2009 | Liu | G06F 3/0412 |
| | | | | 345/173 |
| 2012/0002360 | A1 | 1/2012 | Seo et al. | |
| 2014/0111954 | A1 * | 4/2014 | Lee | G06F 1/1641 |
| | | | | 361/749 |
| 2014/0362513 | A1 | 12/2014 | Nurmi | |
| 2016/0268542 | A1 * | 9/2016 | Suzuki | H10K 59/131 |
| 2017/0068275 | A1 * | 3/2017 | Lee | G06F 1/1643 |
| 2017/0092892 | A1 * | 3/2017 | Zhang | H04M 1/0268 |
| 2017/0321087 | A1 * | 11/2017 | Moon | C09J 11/06 |
| 2018/0157090 | A1 * | 6/2018 | Kim | G02F 1/133308 |
| 2018/0192527 | A1 * | 7/2018 | Yun | G06F 1/1681 |
| 2019/0107750 | A1 * | 4/2019 | Chen | G02F 1/133514 |
| 2019/0196550 | A1 * | 6/2019 | Kim | B32B 27/308 |
| 2020/0051881 | A1 * | 2/2020 | Park | B32B 27/06 |
| 2020/0178403 | A1 * | 6/2020 | Zhai | H05K 5/0217 |
| 2021/0365074 | A1 * | 11/2021 | Mehandjiysky | H04M 1/0216 |
| 2022/0039267 | A1 | 2/2022 | Kim | |
| 2022/0132689 | A1 * | 4/2022 | Lee | G06F 1/1616 |
| 2024/0099049 | A1 * | 3/2024 | Choi | H04M 1/0268 |
| 2024/0164031 | A1 * | 5/2024 | Ha | G06F 1/16 |

FOREIGN PATENT DOCUMENTS

| | | | |
|---|---|---|---|
| KR | 10-2018-0062275 | A | 6/2018 |
| KR | 10-2020-0067023 | A | 6/2020 |
| KR | 10-2248593 | B1 | 5/2021 |
| KR | 10-2022-0016342 | A | 2/2022 |

* cited by examiner

DISPLAY APPARATUS

CROSS-REFERENCE TO RELATED APPLICATIONS

This application claims priority to, and the benefit of, Korean Patent Application No. 10-2022-0150624, filed on Nov. 11, 2022, the entire contents of which are hereby incorporated by reference.

BACKGROUND

The present disclosure herein relates to a foldable display device.

Electronic apparatuses, such as smart phones, digital cameras, laptop computers, navigation units, and smart televisions, for providing an image to a user, include display devices for displaying the image. Such a display device generates an image, and provides the image to the user through a display screen.

Recently, with the technological development for the display devices, various types of display devices have been developed. For example, a flexible display device that can be folded or rolled is being developed. The flexible display device that can be changed into various shapes may be easy to carry, and may improve user convenience.

The display device may include a display panel, a window located on the display panel, and a window protective layer located on the window.

SUMMARY

The present disclosure provides a display device having an improved aesthetic appearance.

One or more embodiments of the present disclosure provides a display device including a display panel configured to be folded about a folding axis extending in a first direction, a window above the display panel, an adhesive member between the window and the display panel, a first frame covering an edge of the display panel and an edge of the window, a second frame between the first frame and the window, and a coupling member between the first frame and the second frame, having elasticity, and coupling the first frame to the second frame, wherein the first frame corresponds to a first bezel region in an unfolded state in which the display panel is unfolded, and wherein the first frame and the second frame correspond to a second bezel region, which is different from the first bezel region, in a folded state in which the display panel is folded.

An overlapping area between the first frame and the second frame in a plan view in the unfolded state may be different from an overlapping area between the first frame and the second frame in the plan view in the folded state.

A portion of the second frame may overlap the first frame in the plan view in the unfolded state, and may not overlap the first frame in the plan view in the folded state.

The coupling member may have different respective shapes in the unfolded and folded states.

The adhesive member may have different respective shapes in the unfolded and folded states.

The second frame may extend in the first direction, and may include a bar-shaped portion.

The second frame may further include a bent portion that is bent from the bar-shaped portion, and that is parallel to a third direction crossing the first direction.

The bent portion may be spaced apart from the coupling member in a second direction crossing the first direction and the third direction.

An overlapping area between the first frame and the bent portion in the folded state may be substantially equal to an overlapping area between the first frame and the bent portion in the unfolded state.

The display device may further include an additional coupling member between the second frame and the window, having elasticity that is less than or equal to the elasticity of the coupling member, and coupling the second frame to the window.

The additional coupling member may contact an upper surface of the window.

The second frame may define a recessed portion for receiving the coupling member therein.

The second frame may define a pass-through portion therethrough, wherein the coupling member contacts the additional coupling member via the pass-through portion.

The first frame may define an accommodating portion for accommodating a portion of the second frame therein in the unfolded state, wherein the second frame is removed from the accommodating portion in the folded state.

In one or more embodiments of the present disclosure, a display device includes a display panel configured to be folded about a folding axis extending in a first direction, a window above the display panel, an adhesive member between the window and the display panel, and a frame covering a portion of the display panel, and providing a first bezel region in an unfolded state in which the display panel is unfolded, and a second bezel region, which is different from the first bezel region, in a folded state in which the display panel is folded, the frame including a first frame covering an edge of the display panel and an edge of the window, a second frame between the first frame and the window, and a coupling member between the first frame and the second frame, and coupling the first frame to the second frame, wherein each of the first bezel region and the second bezel region corresponds to a region onto which the first frame and the second frame are projected in a plan view.

The coupling member may have elasticity.

The coupling member may include a first coupling member between the first frame and the second frame, and a second coupling member between the second frame and the window, having elasticity that is less than or equal to the elasticity of the first coupling member, and coupling the second frame to the window.

The second coupling member may have a substantially same shape in the folded and unfolded states.

The second bezel region may have a larger area than the first bezel region.

A region of the second bezel region that extends in a direction crossing the folding axis may be substantially equal to a region of the first bezel region that extends in the direction crossing the folding axis, wherein a region of the second bezel region that extends in a direction parallel to the folding axis has a larger area than a region of the first bezel region that extends in the direction parallel to the folding axis.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings.

DETAILED DESCRIPTION

Figure 1A:
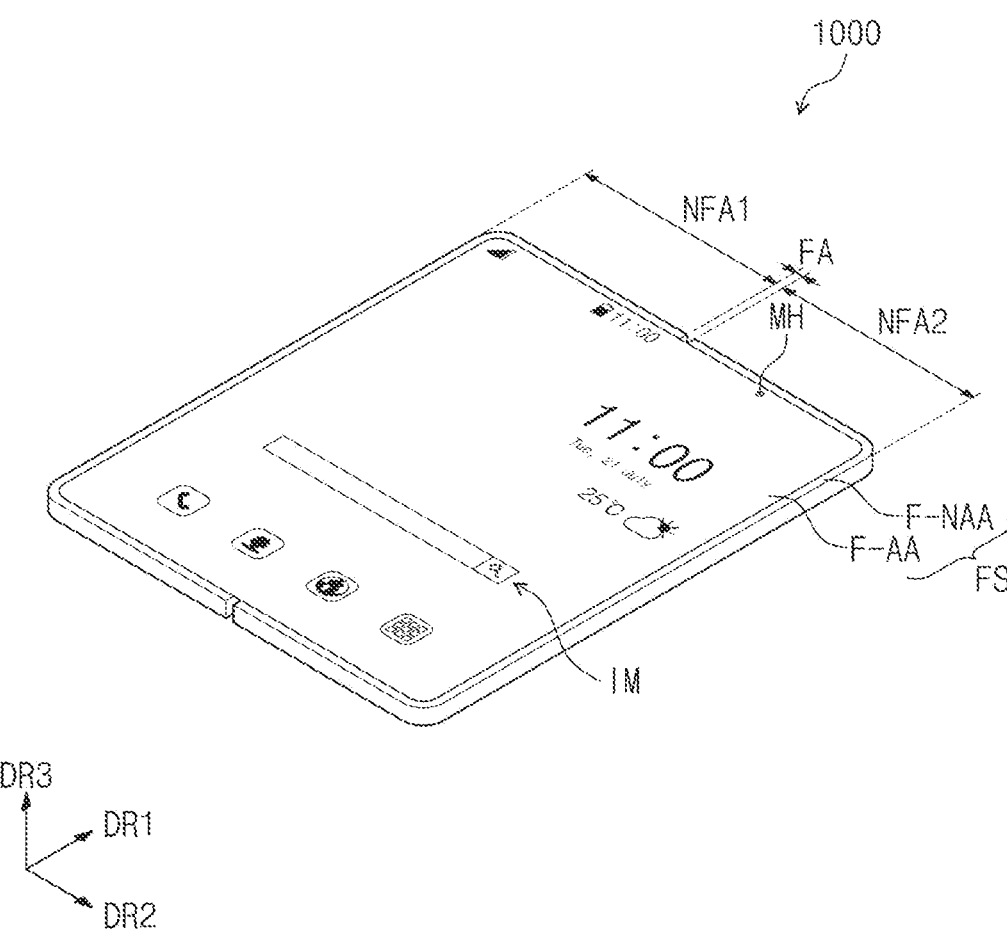
FIGS. 1A to 1D are perspective and plan views of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure.

Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
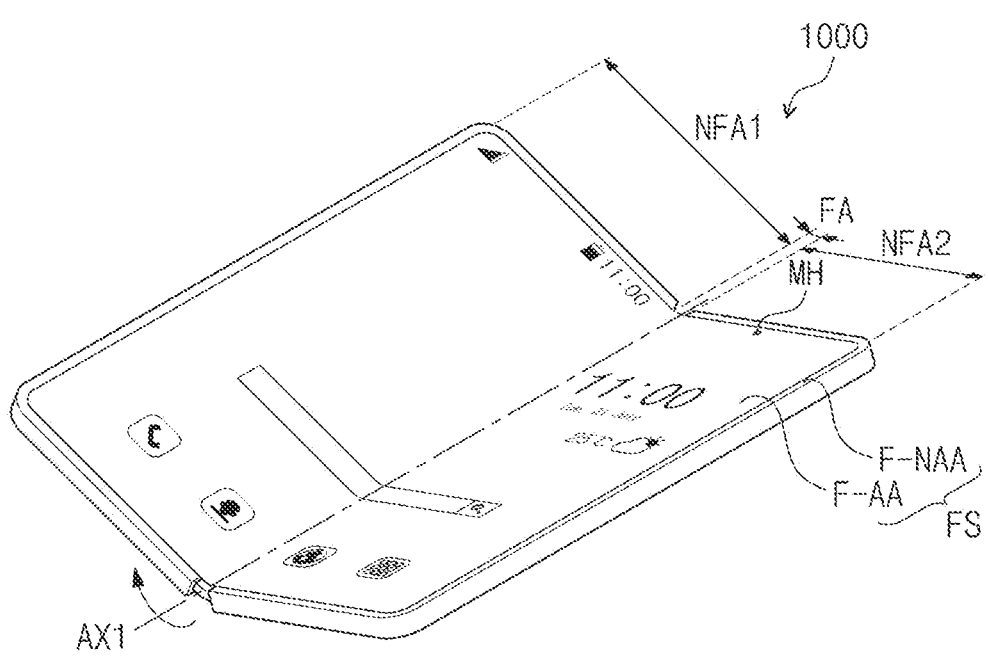
Figure 1B:
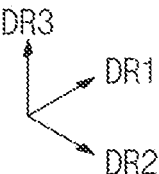
Figure 1C:
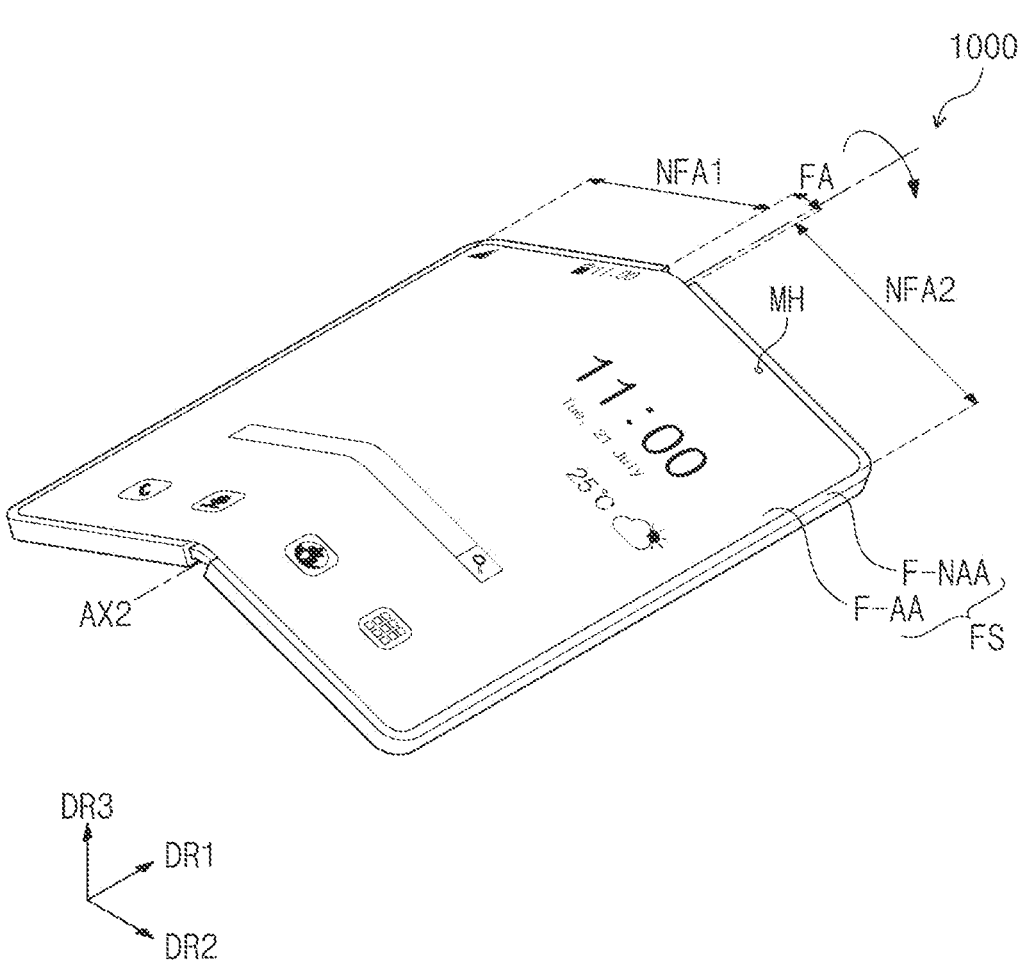
Figure 1D:
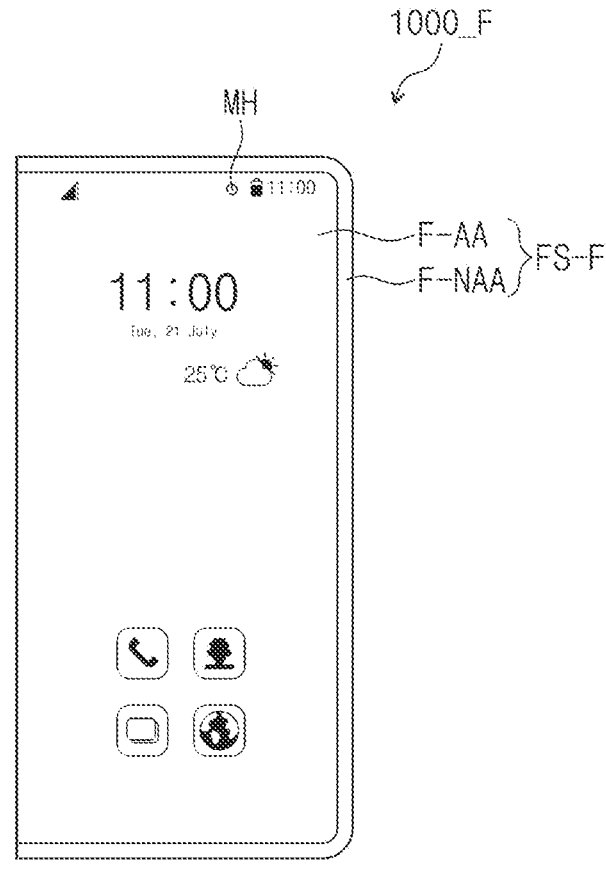
Figure 1D:
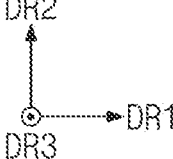

FIGS. 1A to 1D are perspective and plan views of a display device according to one or more embodiments of the present disclosure. FIG. 1A is a perspective view illustrating a state in which an electronic apparatus 1000 is unfolded, and FIGS. 1B to 1D are perspective and plan views illustrating a state in which the electronic apparatus 1000 is folded. FIG. 1D is a plan view illustrating a state in which an electronic apparatus 1000 is folded. Hereinafter, one or more embodiments of the present disclosure will be described with reference to FIGS. 1A and 1D.

The electronic apparatuses 1000 and 1001 may be devices activated in response to an electrical signal. The electronic apparatuses 1000 and 1001 may include various embodiments. For example, the electronic apparatuses 1000 and 1001 may include a tablet, a laptop, a computer, a smart television, or the like. In one or more embodiments, the electronic apparatuses 1000 and 1001 are illustrated as a smart phone.

The electronic apparatuses 1000 and 1001 may display an image IM in a third direction DR3, and onto a first display surface FS that is parallel to each of a first direction DR1 and a second direction DR2. The first display surface FS on which the image IM is displayed may correspond to the front surfaces of the electronic apparatuses 1000 and 1001. The image IM may include static images as well as dynamic images. In FIGS. 1A to 1D, an internet search window and a watch window are illustrated as examples of the image IM.

In one or more embodiments, in an unfolded state, a front surface (or an upper surface) and a rear surface (or a lower surface) of each component are defined with respect to the direction in which the image IM is displayed. The front and rear surfaces are opposed to each other in the third direction DR3, and the normal direction of each of the front and rear surfaces may be parallel to the third direction DR3.

The distance between the front surface and the rear surface in the third direction DR3 may represent the thickness/height of the electronic apparatus 1000 in the third direction DR3. Here, directions indicated as the first to third directions DR1, DR2, and DR3 may have a relative concept, and thus may be changed to other directions.

The electronic apparatus 1000 and 1001 may sense an external input applied from the outside. The external input may include an input of a user. The input of the user may include various types of inputs, such as a portion of the user's body, an electromagnetic pen, light, heat, or pressure.

For example, the external input may include not only a touch by a part of the user's body, such as a hand, but also an external input (for example, hovering) applied when approaching the electronic apparatuses 1000 and 1001, or when brought close thereto within a distance (e.g., predetermined distance). Also, various types, such as force, pressure, temperature, and light are possible. Also, the electronic apparatuses 1000 and 1001 according to one or more embodiments of the present disclosure may sense an external input from the pen that generates a magnetic field. Also, the electronic apparatuses 1000 and 1001 may sense a plurality of inputs different from each other. For example, the electronic apparatuses 1000 and 1001 may sense the external input from the pen and the external input from the user's hand.

In one or more embodiments, the pen may be attached to and detached from the inside or outside of the electronic apparatus 1000, and the electronic apparatus 1000 may provide and receive respective signals in response to the attachment and detachment of the pen.

A display surface FS may include a first active region F-AA (an active region) and a first peripheral region F-NAA (a peripheral region). The peripheral region F-NAA is adjacent to the active region F-AA. The peripheral region F-NAA may have light transmittance that is lower than that of the active region F-AA, and may have a certain color.

In one or more embodiments, a certain electronic module region MH may be defined in a display surface FA. The electronic module region MH is illustrated as being provided in the active region F-AA, but the present disclosure is not limited thereto. The electronic module region MH may be provided in the peripheral region F-NAA. The electronic module region MH may be a region in which at least one of electronic modules described later is located. For example, the electronic apparatus 1000 may capture an image of, and/or may sense, an external subject via the electronic module region MH.

In one or more embodiments, the peripheral region F-NAA may surround the active region F-AA. Accordingly, the shape of the active region F-AA may be substantially defined by the peripheral region F-NAA. However, this is merely illustrated as an example, and the peripheral region F-NAA may be located adjacent to only one side of the active region F-AA, or may be omitted.

The electronic apparatus 1000 according to one or more embodiments of the present disclosure may be folded about a certain folding axis. For example, referring to FIG. 1B, a virtual first folding axis AX1 extending in the first direction DR1 may be defined in the electronic apparatus 1000. The first folding axis AX1 may extend in the first direction DR1 on the display surface FS.

The display surface FS of the electronic apparatus 1000 may include a folding region FA, which is folded about the first folding axis AX1, and a first non-folding region NFA1 and a second non-folding region NFA2, which are spaced apart from each other in the second direction DR2 with the folding region FA therebetween. The electronic apparatus 1000 may be folded about the first folding axis AX1 in a direction in which the first non-folding region NFA1 and the second non-folding region NFA2 face each other. That is, the electronic apparatus 1000 may be folded in an in-folding manner.

Also, as illustrated in FIGS. 1C and 1D, an electronic apparatus 1000 may be folded about a second folding axis AX2 in a direction in which a first non-folding region NFA1 and a second non-folding region NFA2 are opposed to each other. That is, the electronic apparatus 1000 may be folded in an out-folding manner. When the electronic apparatus 1000 is completely folded, a display surface FS-F having an area that is relatively less than that of the display surface FS in the unfolded state may be provided as illustrated in FIG. 1D.

The electronic apparatus 1000 may operate in only one manner selected among the in-folding manner or the out-folding manner about one folding axis. Also, the electronic apparatus 1000 may operate in the in-folding manner or the out-folding manner about one folding axis.

Here, in one or more embodiments, the electronic apparatus 1000 may be folded about a plurality of folding axes which are spaced apart from each other in the first direction DR1. The electronic apparatus 1000 according to one or more embodiments of the present disclosure may have various embodiments as long as it is able to display the image IM and is able to fold. The electronic apparatus 1000 is not particularly limited.

Figure 2A:
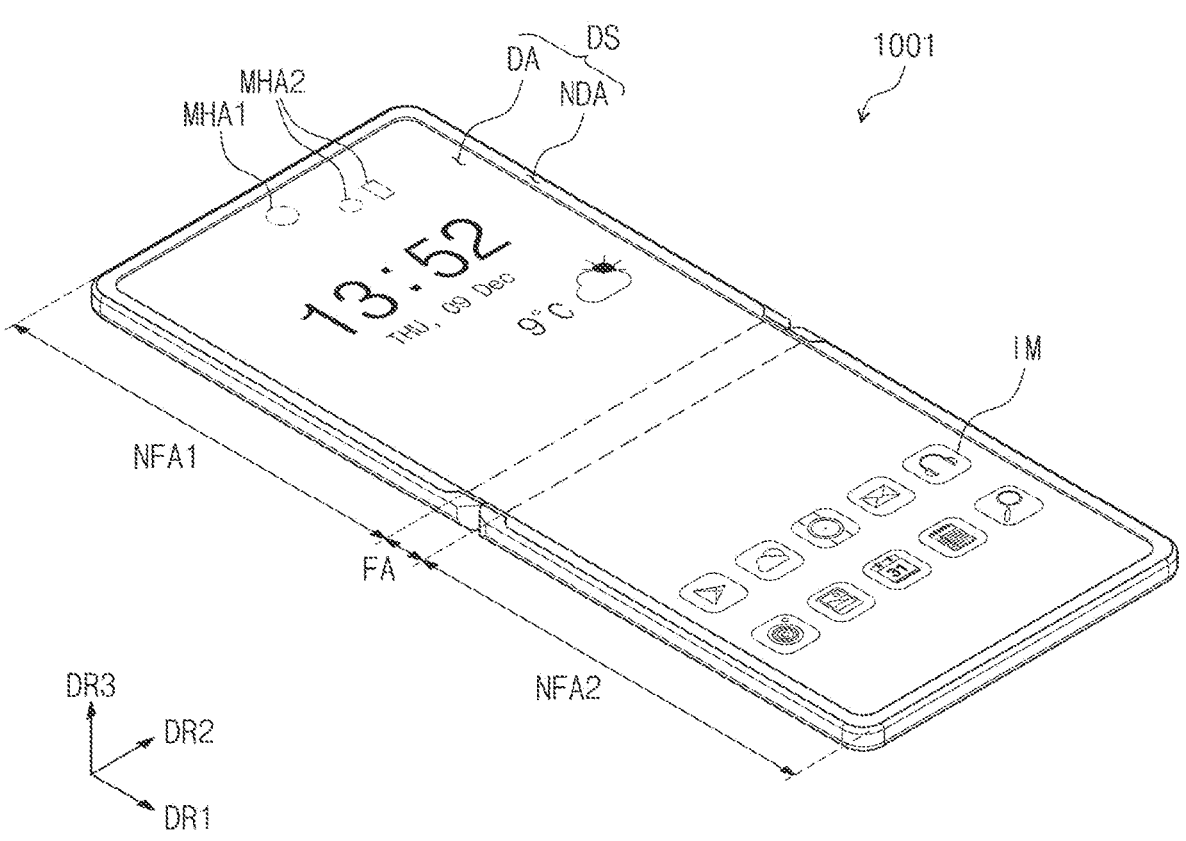
FIGS. 2A and 2B are perspective views of a display device according to one or more embodiments of the present disclosure.
Figure 2B:
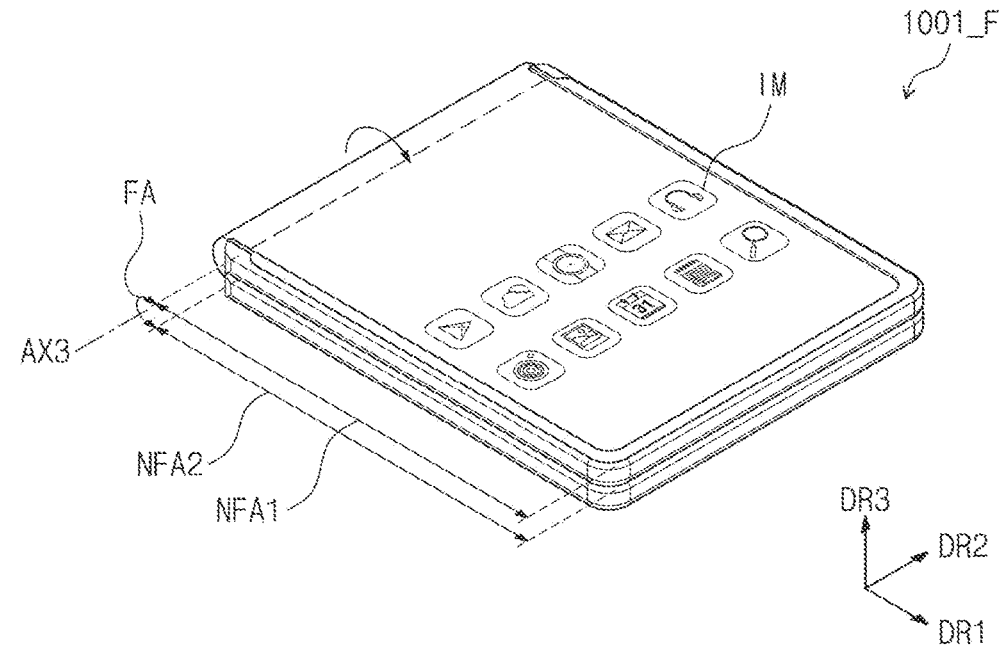

FIGS. 2A and 2B are perspective views of a display device according to one or more embodiments of the present disclosure. FIG. 2A illustrates an electronic apparatus 1001 in an unfolded state, and FIG. 2B illustrates an electronic apparatus 1001 in a folded state. Hereinafter, one or more embodiments of the present disclosure will be described with reference to FIGS. 2A and 2B. Here, the same reference numerals may be given to the same components as those illustrated in FIGS. 1A to 1D, and their duplicated descriptions will be omitted.

The electronic apparatus 1001 may have a rectangular shape that has long sides extending in the first direction DR1, and short sides extending in the second direction DR2 crossing the first direction DR1. However, the present disclosure is not limited thereto, and the electronic apparatus 1001 may have various shapes, such as a circle and a polygon. The electronic apparatus 1001 may include a foldable display.

Unlike the electronic apparatus 1000 illustrated in FIG. 1A, the electronic apparatus 1001 may be folded with respect to a folding axis AX3 extending in the second direction DR2. Accordingly, a first non-folding region NFA1, a folding region FA, and a second non-folding region NFA2 may be arranged in the first direction DR1.

Referring to FIG. 2B, in the electronic apparatus 1001 in a folded state, a display surface on which an image is displayed may be visually recognized by a user. Information provided by the electronic apparatus 1001 may be suitably viewed by the user through the electronic device 1001 even in a folded state. According to one or more embodiments of the present disclosure, a foldable display is enough for the electronic apparatus 1001. The position of the folding axis AX3 may be diversely changed, and is not particularly limited.

Figure 3A:
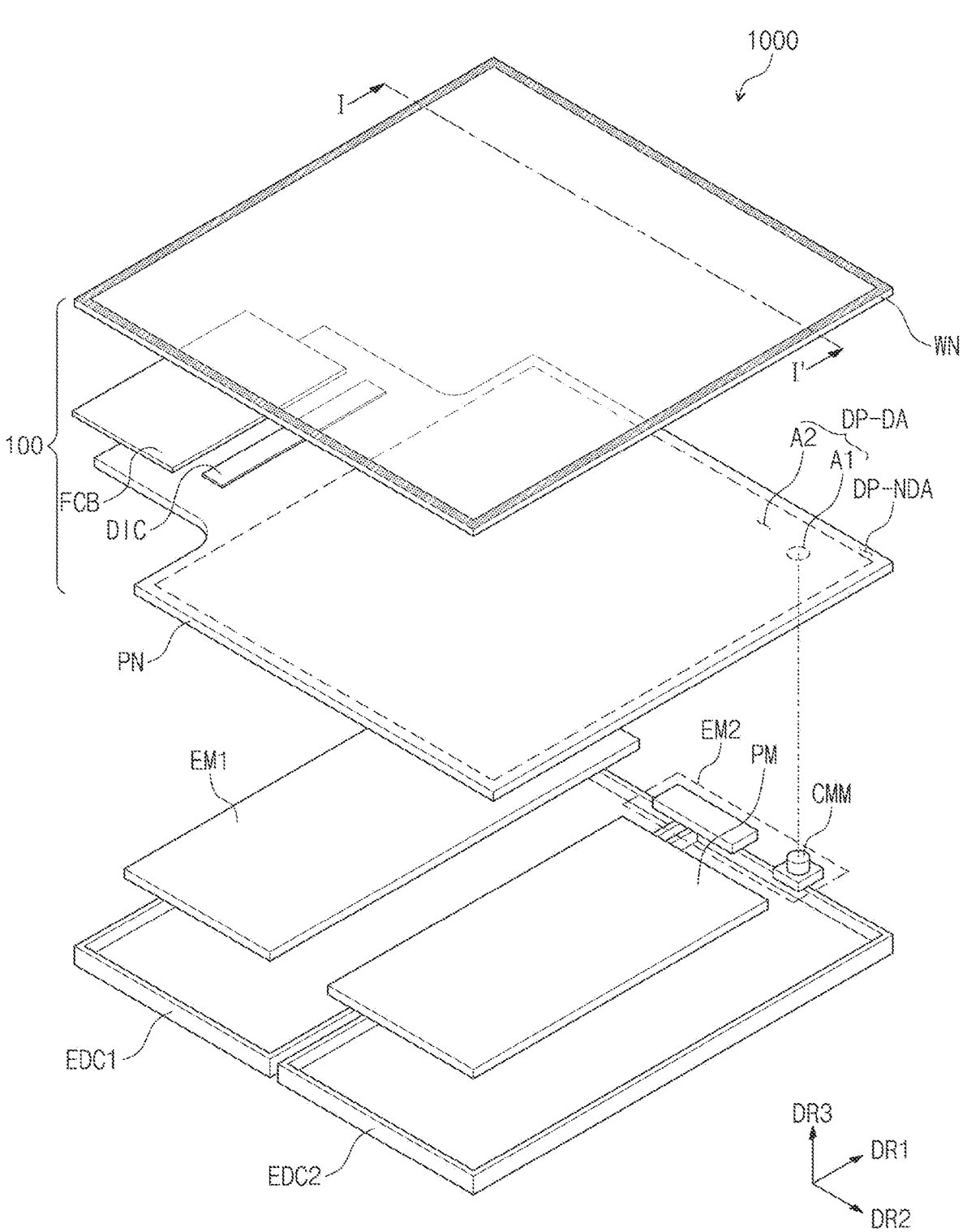
FIG. 3A is an exploded perspective view of a display device according to one or more embodiments of the present disclosure.
Figure 3B:
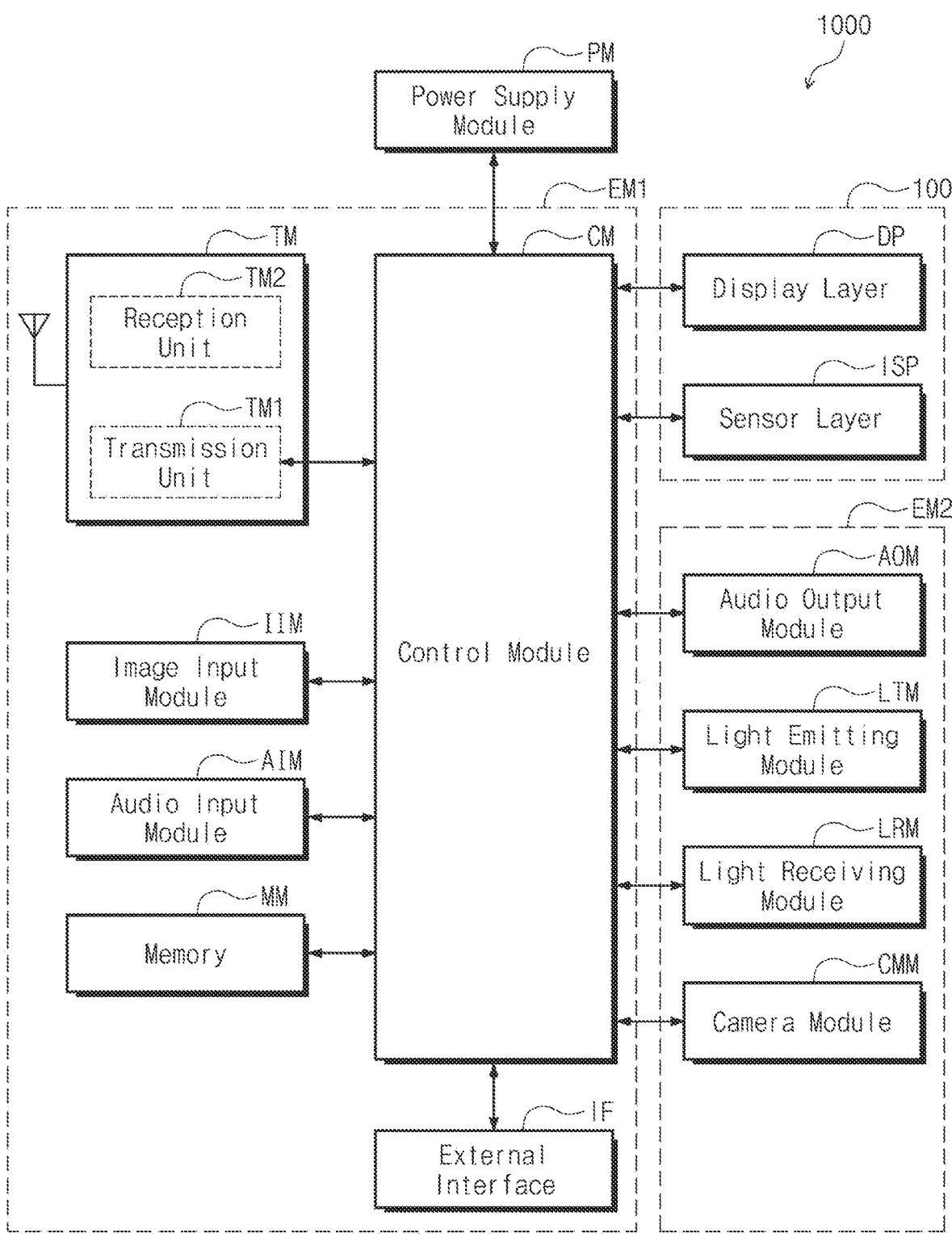
FIG. 3B is a block diagram of a display device according to one or more embodiments of the present disclosure.

FIG. 3A is an exploded perspective view of a display device according to one or more embodiments of the present disclosure. FIG. 3B is a block diagram of a display device according to one or more embodiments of the present disclosure. Hereinafter, one or more embodiments of the present disclosure will be described with reference to FIGS. 3A and 3B.

Referring to FIGS. 3A and 3B, the electronic apparatus 1000 may include a display device 100, a first electronic module EM1, a second electronic module EM2, a power supply module PM, and housings EDC1 and EDC2. The electronic apparatus 1000 may further include a mechanical structure for controlling a folding operation of the display device 100.

The display device 100 may include a window WN and a display panel PN. The window WN may provide a front surface of the electronic apparatus 1000.

Only the display panel PN and the window WN are illustrated as components of the display device 100 in FIG. 3A, but the display device 100 may include a stack structure in which a plurality of components substantially including the display panel PN are stacked. For example, at least one element located between the display panel PN and the window WN and/or between the display panel PN and the electronic modules EM1 and EM2 may be further included. The stack structure of the display device 100 will be described later in detail.

The display panel PN includes a display region DP-DA and a non-display region DP-NDA. The display region DP-DA may correspond to the active region F-AA (see FIG. 1A) described above, and the non-display region DP-NDA may correspond to a peripheral region F-NAA (see FIG. 1A) described above. As used herein, "a region/portion corresponds to another region/portion" may indicate that they overlap each other but are not limited to the same area.

The display region DP-DA may include a first region A1 and a second region A2. The first region A1 may overlap or correspond to the electronic module EMA (see FIG. 1A) of the electronic apparatus 1000. In one or more embodiments, the first region A1 is illustrated as a circle, but may have various shapes, such as a polygon, an ellipse, a figure having at least one curved side, or an irregular shape, and is not particularly limited. The first region A1 may be referred to as a component region, and the second region A2 may be referred to as a main display region or a general display region.

The first region A1 may have higher light transmittance than the second 1 region A2. Also, the resolution of the first region A1 may be lower than the resolution of the second region A2, but the present disclosure is not limited thereto. For example, the first region A1 has a higher light transmittance than the second region A2, but the resolution of the first region A1 may be substantially the same as the resolution of the second region A2. The first region A1 may overlap a camera module CMM, which will be described later. In one or more embodiments of the present disclosure, a portion of the display panel PN corresponding to the first region A1 may be removed. Therefore, the image may be omitted from the first region A1.

The display panel PN may include a display layer DP and a sensor layer ISP.

The display layer DP may be a substantial component for generating an image. The display layer DP may include a light-emitting display layer. For example, the display layer DP may include an organic light-emitting display layer, an inorganic light-emitting display layer, an organic-inorganic light-emitting display layer, a quantum dot display layer, a micro LED display layer, or a nano LED display layer.

The sensor layer ISP may sense an external input applied from the outside. The external input may include an input of a user. The input of the user may include various types of external inputs, such as a portion of the user's body, light, heat, a pen, or pressure.

A driving unit DIC and a circuit board FCB may include driving elements for driving pixels of the display panel PN. The driving unit DIC may include, for example, a gate-driving circuit or a data driving circuit, and the circuit board FCB may include, for example, a timing control circuit or a power supply circuit. The driving unit DIC may be located in the non-display region DP-NDA. However, this is merely illustrated as an example, and the driving unit DIC may be located in the display region DP-DA. The position of the driving unit DIC is not particularly limited. FIG. 3A illustrates a structure in which the driving unit DIC in the form of a chip is mounted on the display panel PN, but the present disclosure is not limited thereto. For example, the driving unit DIC is mounted to the circuit board FCB and may be connected to the display panel PN via the circuit board FCB.

The power supply module PM supplies power required for the overall operation of the electronic apparatus 1000. The power supply unit PM may include a general battery module. In one or more embodiments, the circuit board FCB may be connected to the power supply module PM and receive power, and the power required for the display panel PN or the driving unit DIC may be supplied via the circuit board FCB.

The first electronic module EM1 and the second electronic module EM2 may include various functional modules for operating the electronic apparatus 1000. Each of the first electronic module EM1 and the second electronic module EM2 may be directly mounted to a motherboard electrically connected to the display panel PN, or may be mounted to a separate substrate and electrically connected to a motherboard via a connector or the like. The motherboard may be provided separately or may correspond to the circuit board FCB.

The first electronic module EM1 may include a control module CM, a wireless communication module TM, an image input module IIM, an audio input module AIM, a memory MM, and an external interface IF.

The control module CM controls overall operation of the electronic apparatus 1000. The control module CM may include a microprocessor. For example, the control module CM activates or deactivates the display panel PN. The control module CM may control other modules, such as the image input module IIM or the audio input module AIM on the basis of a touch signal received from the display panel PN.

The wireless communication module TM may communicate with an external electronic apparatus via a first network (e.g., a local area communication network, such as Bluetooth, Wi-Fi direct, or infrared data association (IrDA)) or a second network (e.g., wide area communication network, such as a cellular network, the Internet, or a computer network (e.g., LAN or WAN). Communication modules included in the wireless communication module TM may be integrated into one component (e.g., a single chip) or may be implemented as a plurality of components (e.g., multiple chips) separated apart from each other. The wireless communication module TM may transmit and receive audio signals via using general communication lines. The wireless communication module TM may include a transmission unit TM1 that modulates a signal to be transmitted and that transmits the signal and a reception unit TM2, which demodulates a received signal.

The image input module IIM processes an image signal, and coverts the image signal into image data, which may be displayed on the display panel PN. The audio input module AIM receives an external audio signal through a microphone in a recording mode, a voice recognition mode, or the like, and converts the received audio signal into electrical voice data.

The external interface IF may include a connector capable of physically connecting the electronic apparatus 1000 to an external electronic apparatus. For example, the external interface IF serves as an interface connected to an external charger, wired/wireless data ports, a card (for example, a memory card, a SIM/UIM card) socket, or the like.

The second module EM2 may include an audio output module AOM, a light-emitting module LTM, a light-receiving module LRM, a camera module CMM, and the like. The audio output module AOM converts audio data received from the wireless communication module TM or audio data stored in the memory MM, and then outputs the converted audio data to the outside.

The light-emitting module LTM generates and outputs light. The light-emitting module LTM may output infrared light. The light-emitting module LTM may include an LED element. The light-receiving module LRM may sense infrared light. The light-receiving module LRM may be activated when the infrared light having a certain level or higher is sensed. The light-receiving module LRM may include a CMOS sensor. The infrared light generated in the light-emitting module LTM is output and then reflected from an external object (e.g., the finger or face of a user). The reflected infrared light may be incident onto the light-receiving module LRM.

The camera module CMM may capture still images and moving images. A plurality of camera modules CMM may be provided. Some of the camera modules CMM may overlap the first region A1. The external input (e.g., light) may be provided to the camera module CMM via the first region A1. For example, the camera module CMM may capture an external image by receiving natural light via the first region A1.

The housings EDC1 and EDC2 accommodate a display panel PN, first and second electronic modules EM1 and EM2, and a power supply module PM. The housings EDC1 and EDC2 protect components, such as the display panel PN, the first and second electronic modules EM1 and EM2, and the power supply module PM, which are accommodated in the housings EDC1 and EDC2. FIG. 3A illustrates, as an example, two housings EDC1 and EDC2 separated from each other, but the present disclosure is not limited thereto. In one or more embodiments, the electronic apparatus 1000 may further include a hinge structure for connecting the two housings EDC1 and EDC2 to each other. The housings EDC1 and EDC2 may be coupled to the window WN.

Figure 4A:
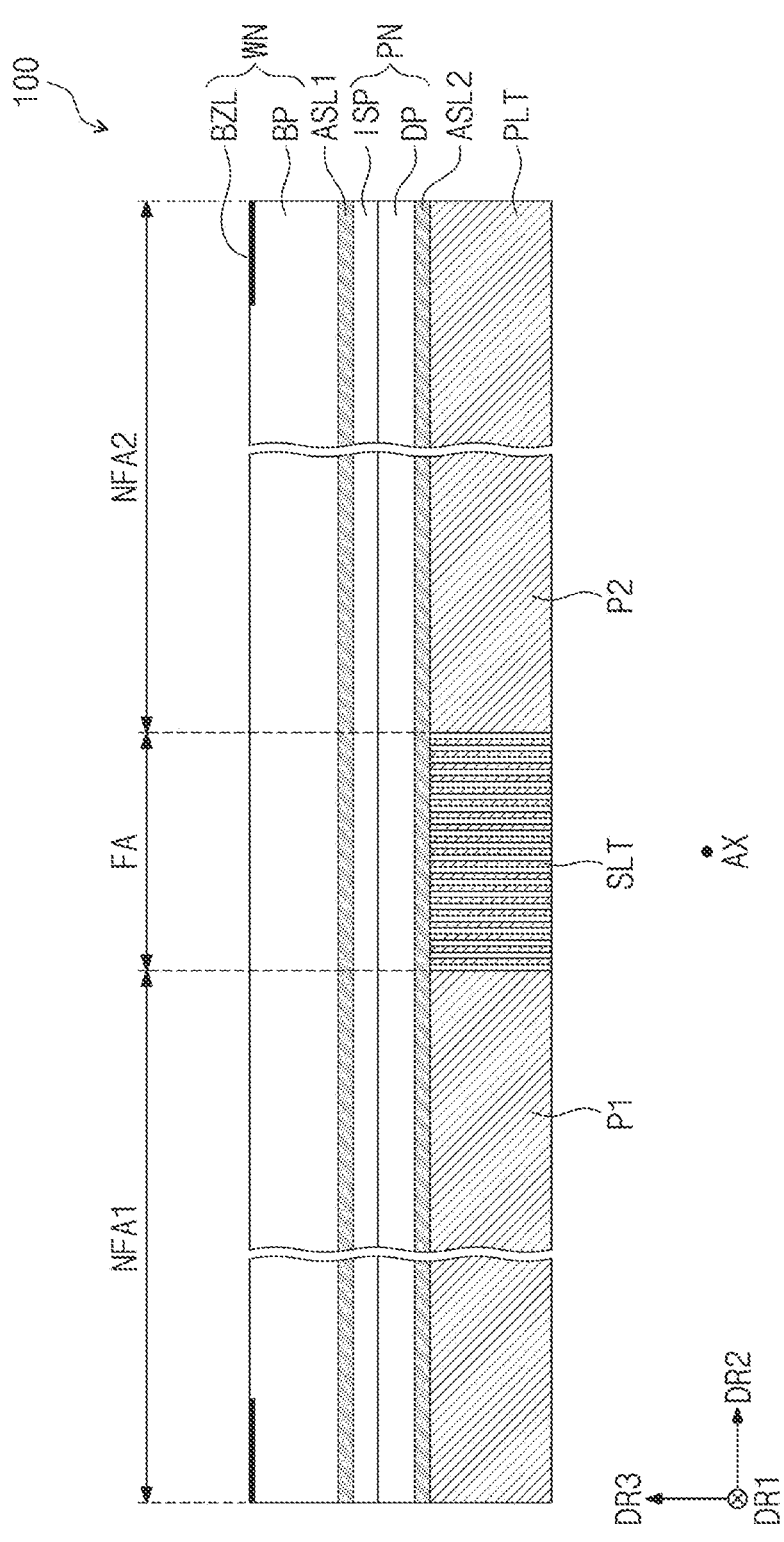
FIGS. 4A and 4B are cross-sectional views of a display device according to one or more embodiments of the present disclosure.
Figure 4B:
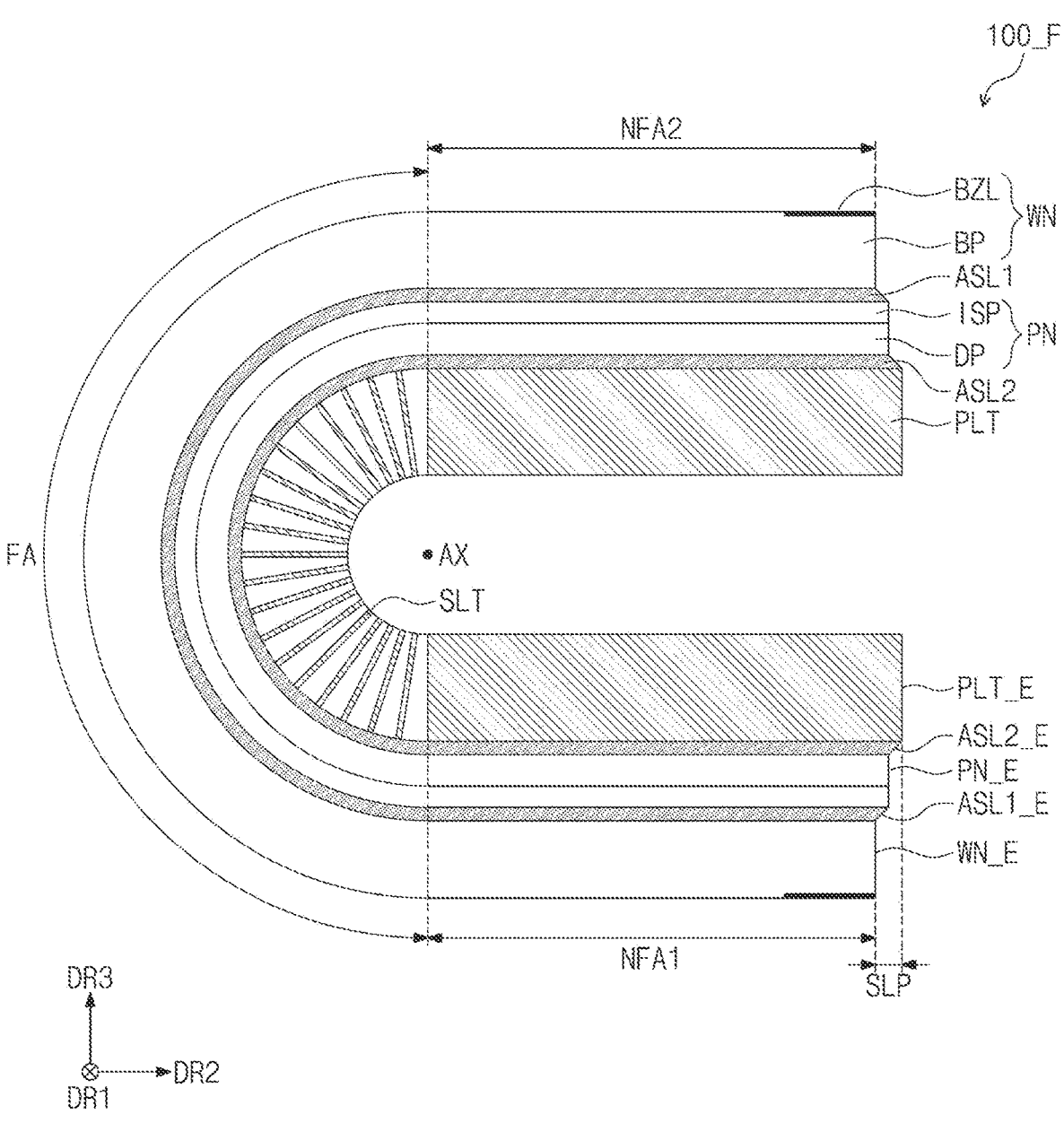

FIGS. 4A and 4B are cross-sectional views of a display device according to one or more embodiments of the present disclosure. FIGS. 4A and 4B are cross-sectional views of a display device, taken along the line I-I' of FIG. 3A. FIG. 4A may be a cross-sectional view of a display device 100 in an unfolded state, and FIG. 4B may be a cross-sectional view of a display device 100_F in a folded state. FIG. 4A may relate to the state of FIG. 1A, and FIG. 4B may relate to the state of FIG. 1D. Hereinafter, one or more embodiments of the present disclosure will be described with reference to FIGS. 4A and 4B. Here, the same reference numerals may be given to the same components as those illustrated in FIGS. 1A to 3B, and their duplicated descriptions may be omitted.

Referring to FIGS. 4A and 4B, the display devices 100 and 100_F may include a window WN, a display panel PN, a lower plate PLT, and a plurality of adhesive layers ASL1 and ASL2. The lower plate PLT and the plurality of adhesive layers ASL1 and ASL2 may correspond to the stack structure described above.

The window WN may include a base substrate BP and a bezel pattern BZL.

The base substrate BP may be optically transparent. The base substrate BP may include, for example, thin film glass or a synthetic resin film. When the base substrate BP includes the thin film glass, the thickness of the base substrate BP may be about 100 μm or less and, for example, about 30 μm, but the thickness of the base substrate BP is not limited thereto. In this case, the base substrate BP may include chemically strengthened glass. As the base substrate BP is made of strengthened glass, the occurrence of wrinkles in the window WN may be reduced or minimized even when folding and unfolding are repeated. Also, the base substrate BP may include a film including a polymer. For example, the base substrate BP may include a polyimide (PI) film or a polyethylene terephthalate (PET) film. As the base substrate BP is made of a film, the occurrence of cracks or the like in the window WN due to folding may be reduced or minimized.

The bezel pattern BZL may overlap the non-display region DP-NDA (see FIG. 3A), and may define the peripheral region F-NAA (see FIG. 1A). The bezel pattern BZL may be located on one surface of the base substrate BP. FIGS. 4A and 4B illustrate, as an example, the bezel pattern BZL located on the upper surface of the base substrate BP. The present disclosure is not limited thereto, and the bezel pattern BZL may be located on the lower surface of the base substrate BP, or may be inserted into the base substrate BP. The bezel pattern BZL includes a colored light-blocking film, and may be formed by, for example, a coating or printing method. The bezel pattern BZL may include a base material and a dye or pigment mixed with the base material. The bezel pattern BZL may have a closed line shape when viewed in a plan view. In one or more embodiments of the present disclosure, the bezel pattern BZL may be omitted.

Here, in one or more embodiments, the display device 100 may further include a protective layer located on the window WN. The protective layer may be a layer for improving impact resistance of the window WN and for preventing scattering when broken. The protective layer may include at least one selected from among a urethane-based resin, an epoxy-based resin, a polyester-based resin, a polyether-based resin, an acrylate-based resin, an acrylonitrile-butadiene-styrene (ABS) resin, and rubber. For example, the protective layer may include at least one of phenylene, polyethyleneterephthalate (PET), polyimide (PI), polyamide (PAI), polyethylene naphthalate (PEN), or polycarbonate (PC).

The lower plate PLT may be located below the display panel PN. The lower plate PLT supports the display panel PN, and maintains the unfolded and folded states of the display device 100.

The lower plate PLT may include a rigid material. The lower plate PLT may include a material having a modulus of elasticity of 10 GPa or more. For example, the lower plate PLT may include glass, plastic, metal, or an alloy, such as SUS, but the material constituting the lower plate PLT is not particularly limited thereto.

The lower plate PLT may include a first section P1, a second section P2, and a plurality of slits SLT. The first section P1 is located in the first non-folding region NFA1 to support the display panel PN, and the second section P2 is located in the second non-folding region NFA2 to support the display panel PN.

The slits SLT overlap the folding region FA. The slits SLT may be formed as a plurality of holes OP defined in a portion of the lower plate PLT that overlaps the folding region FA. The lower plate PLT includes the slits SLT and the holes OP, and thus may be suitably deformed when folded. Also, the slits SLT may include a material that is different from that of the first section P1 or the second section P2. For example, the first section P1 and the second section P2 may include insulating glass or plastic, and the slits SLT may include a single metal or alloy. Accordingly, the slits SLT may stably protect the folding region FA of the display panel PN even in the folded state. However, this is merely described as an example. The slits SLT may be made of the same material as the first section P1 or the second section P2, and are not particularly limited.

A first adhesive layer ASL1 may be located between the window WN and the display panel PN. The first adhesive layer ASL1 may include, for example, a pressure sensitive adhesive (PSA) film or an optically clear adhesive (OCA) member. A second adhesive layer ASL2 may be located between the display panel PN and the lower plate PLT. The second adhesive layer ASL2 may include, for example, a pressure sensitive adhesive (PSA) film or an optically clear adhesive (OCA) member. Also, in one or more embodiments, additional elements are further stacked between the lower plate PLT and the display panel PN, below the lower plate PLT, between the display panel PN and the window WN, and above the window WN. However, the present disclosure is not particularly limited.

In addition, referring to FIG. 4B, a slip section SLP may exist in the display device 100_F in a folded state. For example, an edge of the display device 100_F in a folded state about a folding axis AX is defined by an edge PLT_E of the lower support plate PLT, an edge PN_E of the display panel PN, an edge WN_E of the window WN, and edges ASL1_E and ASL2_E of the adhesive layers ASL1 and ASL2. Folding stress may be applied to each of layers constituting the display device 100_F in the folded state, and the radius of curvature varies according to a distance from the folding axis AX serving as the center of folding. In this case, as inclined surfaces are generated at the edges ASL1_E and ASL2_E of the adhesive layers ASL1 and ASL2 due to shear stress, the folding stress applied to the display device 100_F may be distributed and independently applied to each of the lower support plate PLT, the display panel PN, and the window WN. Accordingly, in a state in which the lower support plate PLT, the display panel PN, and the window WN are coupled, the folding stress to be applied to each component may be reduced compared to when one folding stress is applied to a component. Therefore, folding characteristics of the display device 100 may be enhanced.

Here, as the inclined surfaces are formed at the edges ASL1_E and ASL2_E of the adhesive layers ASL1 and ASL2, and the edges PLT_E, PN_E, and WN_E of the lower support plate PLT, the display panel PN, and the window WN, may be shifted on the cross-section. That is, in the display device 100 in the unfolded state, the edges PLT_E, PN_E, and WN_E of the lower support plate PLT, the display panel PN, and the window WN may be aligned with each other on the cross-section. However, in the display device 100_F in the folded state, the edges PLT_E, PN_E, and WN_E of the lower support plate PLT, the display panel PN, and the window WN may be shifted and dispersed. Accordingly, the slip section SLP, in which the edges PLT_E, PN_E, and WN_E of the lower support plate PLT, the display panel PN, and the window WN are dispersed, may be formed.

Figure 5A:
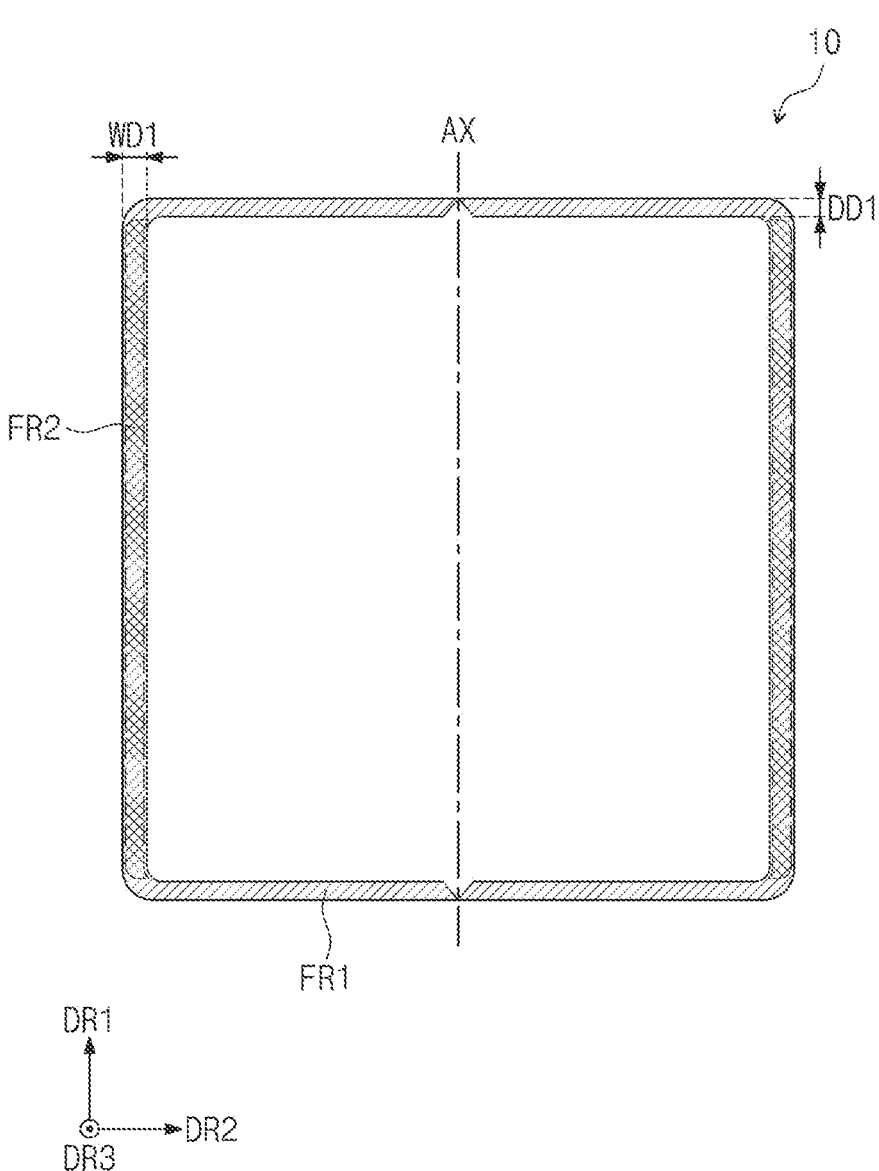
FIGS. 5A and 5B are plan views of a display module according to one or more embodiments of the present disclosure.
Figure 5B:
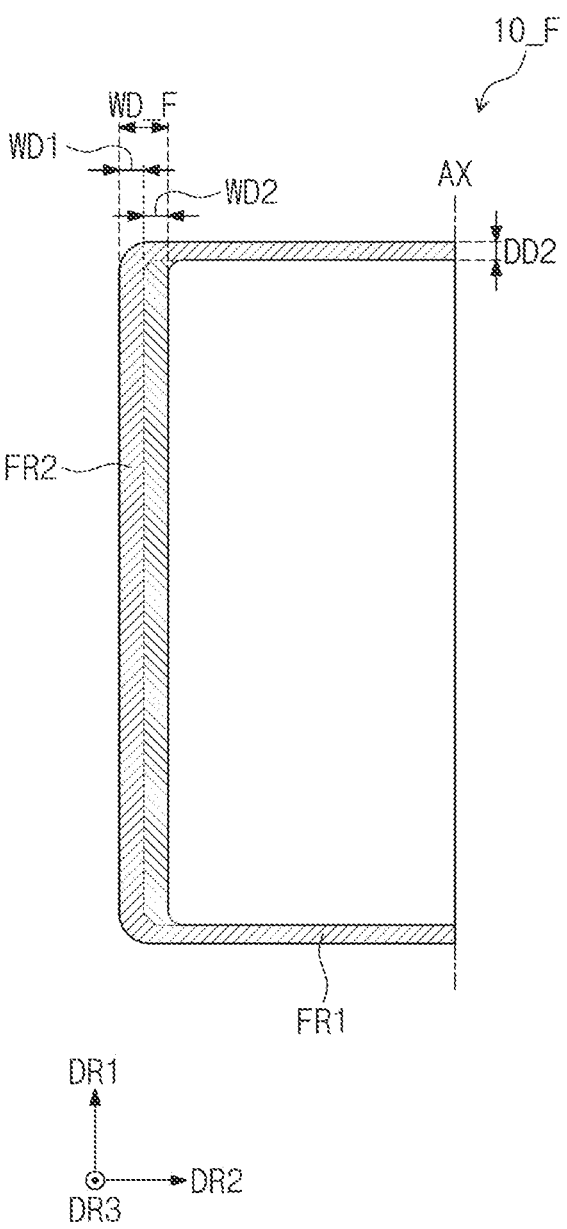
Figure 6A:
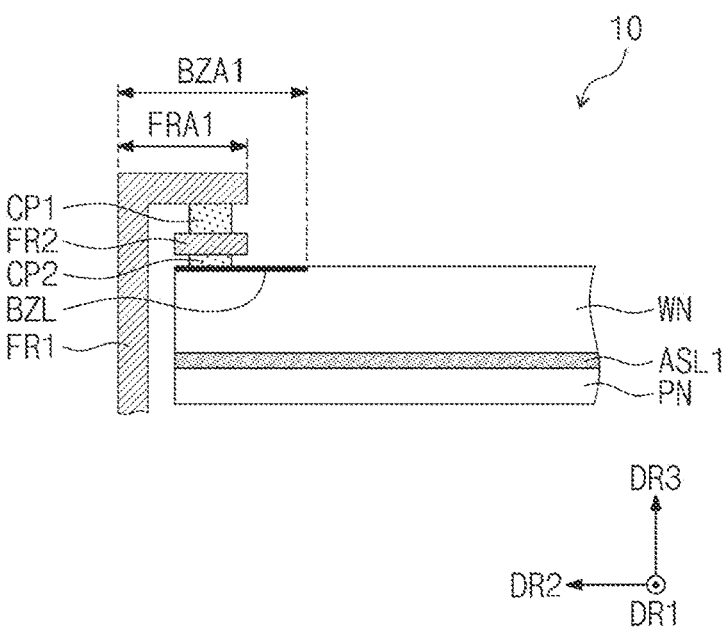
FIGS. 6A and 6B are cross-sectional views of a display module according to one or more embodiments of the present disclosure.
Figure 6B:
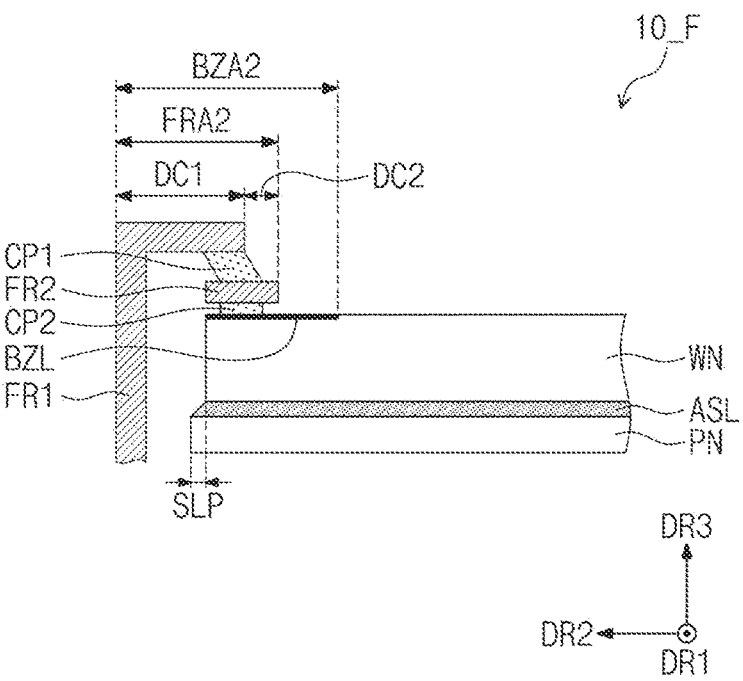

FIGS. 5A and 5B are plan views of a display module according to one or more embodiments of the present disclosure. FIGS. 6A and 6B are cross-sectional views of a display module according to one or more embodiments of the present disclosure. FIGS. 5A and 6A illustrate a display module 10 in an unfolded state, and FIGS. 5B and 6B illustrate a display module 10_F in a folded state. Hereinafter, one or more embodiments of the present disclosure will be described with reference to FIGS. 5A to 6B. Here, the same reference numerals may be given to the same components as those illustrated in FIGS. 1A to 4D, and their duplicated descriptions will be omitted.

Referring to FIG. 6A, the display module 10 may include some components of the electronic apparatus 1000. For example, the display module 10 may include a first frame FR1, a second frame FR2, a display panel PN, a first adhesive layer ASL1, and a window WN. The first frame FR1 and the second frame FR2 may relate to one housing EDC2 of the two housings EDC1 and EDC2 described above.

For example, the first frame FR1 provides a space for accommodating the window WN and the display panel PN that constitute the display device 100, and protects the window WN and the display panel PN from external impact. The first frame FR1 may include at least one bent portion. For example, when viewed in a cross-section, the first frame FR1 may include a side portion, which extends in the third direction DR3 and faces the edges of the display device 100, and a cover portion, which is bent from the side portion in the second direction DR2 and that overlaps at least a portion of the display device 100. In one or more embodiments, the cover portion of the first frame FR1 may define a first deco DC1.

The second frame FR2 may be located between the first frame FR1 and the window WN. For example, the second frame FR2 may be located between the cover portion defining the first deco DC1 and the bezel pattern BZL of the window WN. The second frame FR2 may include the same material as the first frame FR1, or may include a different material from the first frame FR1. For example, the second frame FR2 may include metal, alloy, or plastic, or may include an elastic material, such as film or rubber. Also, the second frame FR2 may have the same thickness as the first frame FR1, or may have a thickness that is less than that of the second frame FR2.

The first frame FR1 and the second frame FR2 may be coupled to each other by a first coupling member CP1. The first coupling member CP1 may have elasticity. For example, the first coupling member CP1 may include various materials, such as rubber, urethane, polymer, or porous material, which may be deformed by the movement of the second frame FR2. Also, the first coupling member CP1 may have a structure, such as a spring or elastic member, which may be physically deformed.

The first coupling member CP1 may be deformed in response to the movement of the second frame FR2. As illustrated in FIGS. 6A and 6B, the second frame FR2 in the display module 10_F in the folded state may move in the second direction DR2. For example, in the display module 10_F in the folded state, a slip section SLP is generated between the display panel PN and the window WN. The second frame FR2 may move a certain distance in the second direction DR2 in response to the movement of the window WN. The first coupling member CP1 has elasticity, and thus may stably couple the second frame FR2 and the first frame FR1 to each other irrespective of the movement of the second frame FR2.

The second frame FR2 and the window WN may be coupled to each other by a second coupling member CP2. The second coupling member CP2 couples the second frame FR2 and the window WN to each other so that the second frame FR2 may be moved in response to the movement of the window WN. Therefore, the second coupling member CP2 may have elasticity that is lower than that of the first coupling member CP1, or may be made of a non-elastic material. In this case, the movement of the second frame FR2 may substantially correspond to the movement of the window WN. Also, the second coupling member CP2 may be made of the same material as the first coupling member CP1. In this case, the movement of the second frame FR2 may be less even when the movement of the window WN is large, and thus, it is possible to reduce or prevent excessive physical deformation of the first coupling member CP1.

In one or more embodiments, the second coupling member CP2 is illustrated as being directly attached to the window WN (e.g., to the bezel pattern BZL). However, this is merely illustrated as an example. When the bezel pattern BZL is inserted into the base substrate BP or is located on the lower surface of the base substrate BP, the second coupling member CP2 may be in contact with the base substrate BP. Also, when an additional coating layer or an additional protective layer is further located on the window WN, the second coupling member CP2 may be in contact with the coating layer or the protective layer. Also, when an additional protective film or the like is located on the window WN, the protective film may be provided in a shape that does not cause interference with the frames FR1 and FR2. In this case, the second coupling member CP2 may be spaced apart from the protective film and attached to the window WN, but is not particularly limited.

Hereinafter, movements of the frames FR1 and FR2 will be described in detail with reference to FIGS. 6A and 6B. Referring to FIG. 6A, a bezel region BZA1, hereinafter a first bezel region BZA1, of the display module 10 in the unfolded state may be substantially defined by a first frame region FRA1 and a bezel BZL. The first frame region FRA1 may be defined by the first frame FR1. In the unfolded state, the second frame FR2 overlaps the first frame FR1, and is located below the first frame FR1. The first bezel region BZA1 shown outside from the third direction may be corresponding to a portion of the bezel BZL and the first frame region FRA1, and the second frame FR2 might not be viewed from the outside due to cover by the first frame FR1.

The first frame FR1 may have a quadrangular frame shape to define the first bezel region BZA1 of the display module 10 when viewed in a plan view. The second frame FR2 may have a bar shape extending in the first direction DR1. The second frame FR2 may include a portion extending in a direction parallel to the folding axis AX. A plurality of second frames FR2 may be provided and respectively located on both sides to cover edges of sides extending in a direction parallel to the folding axis AX.

Referring to FIG. 6B, a bezel region BZA2, hereinafter a second bezel region BZA2, of the display module 10 in the folded state may be substantially defined by a second frame region FRA2 and the bezel BZL (e.g., by the first frame region FRA1 and/or the second frame region FRA2 and the bezel BZL). The second frame region FRA2 may be defined by both the first frame FR1 and the second frame FR2. In the folded state, the second frame FR2 may be moved and at least partially exposed from the first frame FR1. The portion exposed from the first frame FR1 may define a second deco DC2. In the folded state, the second frame region FRA2 of the display module 10 may be formed by both the first deco DC1 and the second deco DC2.

Accordingly, and referring to FIGS. 5A and 5B, in the unfolded state, a width WD1 of the first frame region FRA1 in the first direction DR1 (hereinafter, referred to as a vertical side width) and a width DD1 of the first frame region FRA1 in the second direction DR2 (hereinafter referred to as a horizontal side width) may be associated with a vertical side width and a horizontal side width of the first frame FR1, respectively. In the folded state, a vertical side width WD_F of the second frame region FRA2 may be defined by the sum of a vertical side width WD1 of the first frame FR1 and a vertical side width WD2 of the second frame FR2. Accordingly, the vertical side width WD_F of the second frame region FRA2 in the folded state may be greater than the vertical side width WD1 of the first frame region FRA1 in the unfolded state.

Unlike the above, a horizontal side width DD2 of the second frame region FRA2 in the folded state may be substantially the same as the horizontal side width DD1 of the first frame region FRA1 in the unfolded state. The horizontal sides of the frame regions FRA1 and FRA2 are perpendicular to the folding axis AX, and are thus not affected by the folding stress. Therefore, the occurrence of the slip section SLP may not occur in the horizontal sides. Accordingly, the horizontal sides of the frame regions FRA1 and FRA2 may maintain a slim area irrespective of whether or not folding occurs.

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and not visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained.

Figure 7A:
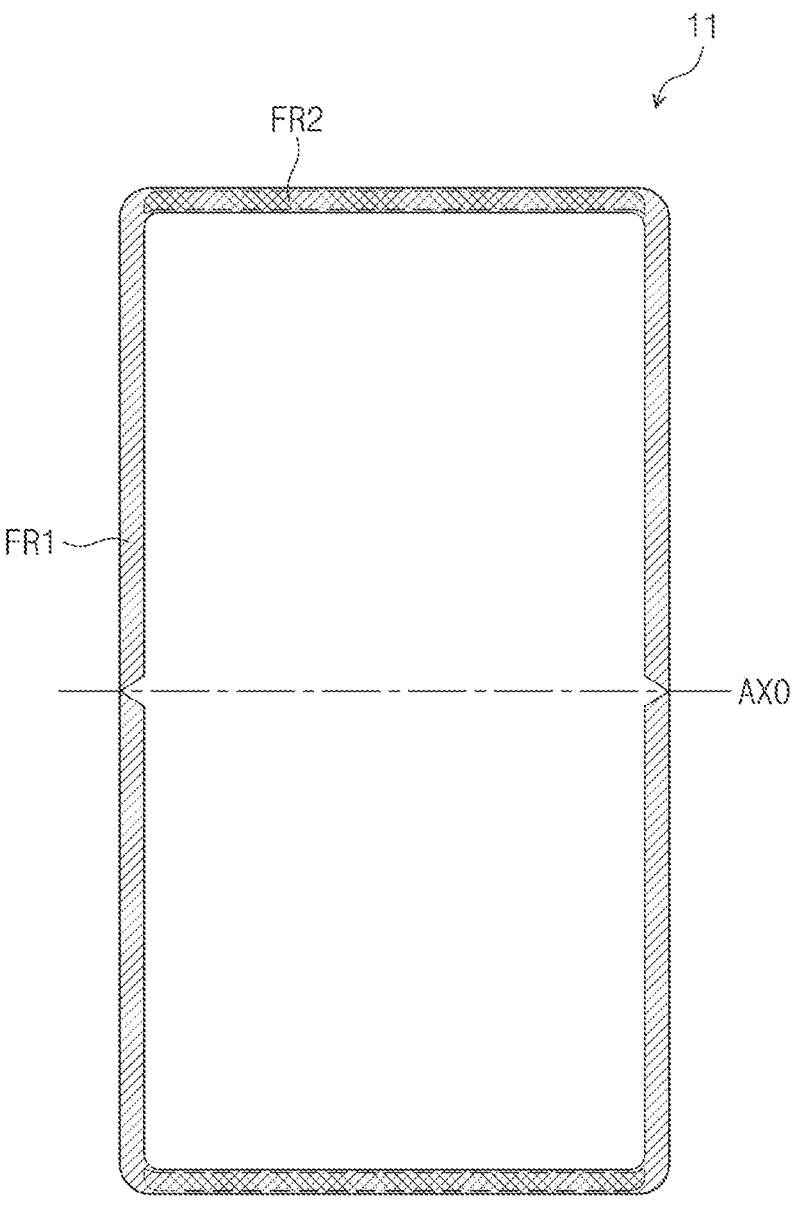
FIGS. 7A and 7B are plan views of a display module according to one or more embodiments of the present disclosure.
Figure 7A:
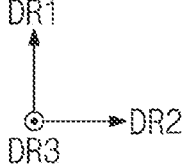
Figure 7B:
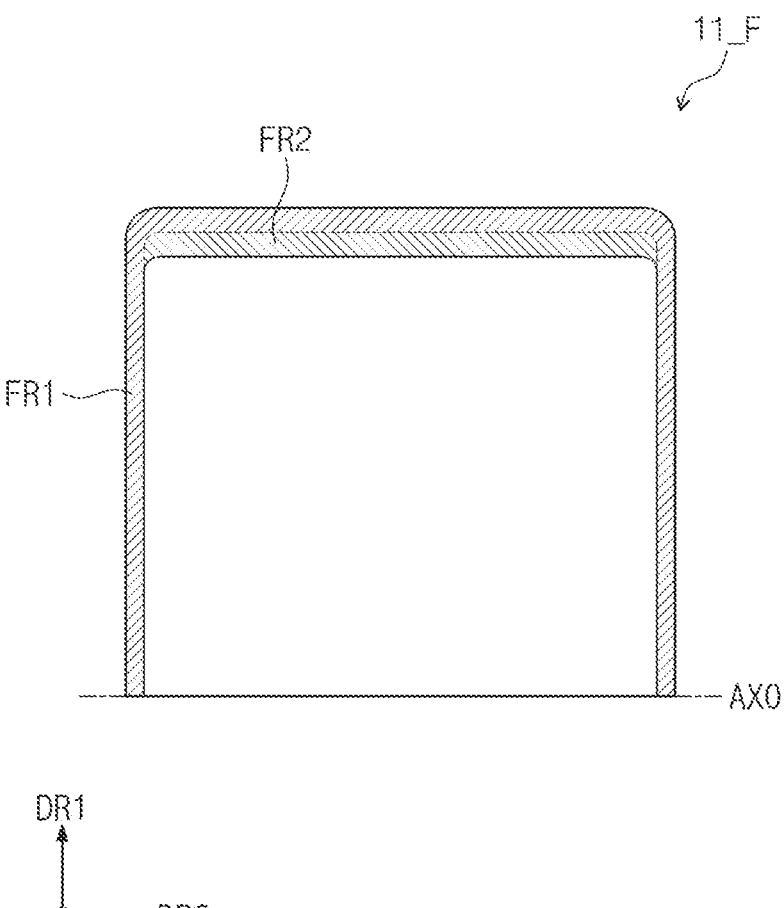

FIGS. 7A and 7B are plan views of a display module according to one or more embodiments of the present disclosure. FIG. 7A illustrates a display module 11 in an unfolded state, and FIG. 7B illustrates a display module 11_F in a folded state. Also, discussion of some components is omitted for ease of description.

The display module 11 illustrated in FIG. 7A may be a part that constitutes the electronic apparatus 1001 illustrated in FIG. 2A. That is, the display module 11 includes substantially the same components as the display module 10 illustrated in FIG. 6A (see FIG. 6A), but may be different with respect to a folding axis AX0. The display module 11 includes a display panel PN (see FIG. 6A), a window WN (see FIG. 6A), a first adhesive layer ASL1, a first frame FR1, a second frame FR2, a first coupling member CP1 (see FIG. 6A), and a second coupling member CP2 (see FIG. 6A), but may be folded about the folding axis AX0 extending in the second direction DR2. Hereinafter, duplicated descriptions will be omitted.

Referring to FIG. 7A, a first frame region FRA1 (see FIG. 6A) of the display module 11 in the unfolded state may be substantially defined by the first frame FR1. In the unfolded state, the second frame FR2 overlaps the first frame FR1, and is located below the first frame FR1.

The first frame FR1 may have a rectangular frame shape that surrounds the outside of the display module 11 when viewed in a plan view. The second frame FR2 may have a bar shape (e.g., a bar-shaped portion) extending in the second direction DR2. The second frame FR2 may include a portion extending in a direction parallel to the folding axis AX0. A plurality of second frames FR2 may be provided and respectively located on both sides to cover edges of sides extending in a direction parallel to the folding axis AX0.

Referring to FIG. 7B, a second frame region FRA2 (see FIG. 6B) of the display module 11_F in the folded state may be substantially defined by both the first frame FR1 and the second frame FR2. In the folded state, the second frame FR2 may be moved and at least partially exposed from the first frame FR1. The portion exposed from the first frame FR1 may define a second deco DC2 (see FIG. 6B).

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and not visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained.

Figure 8A:
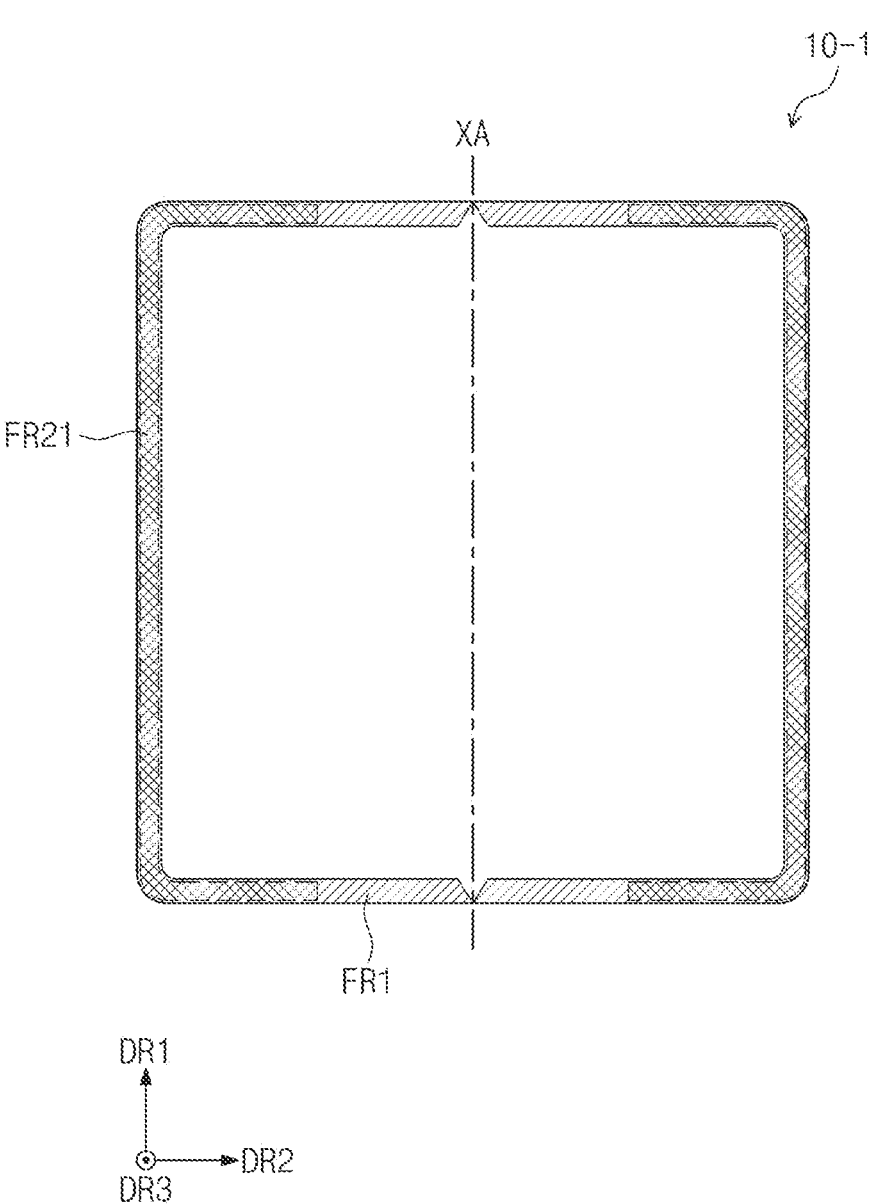
FIGS. 8A and 8B are plan views of a display module according to one or more embodiments of the present disclosure.
Figure 8B:
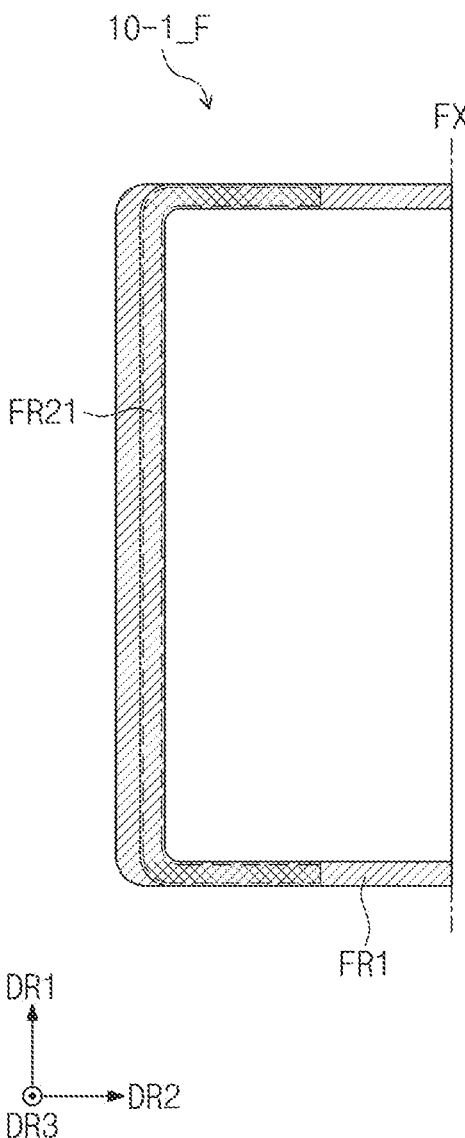

FIGS. 8A and 8B are plan views of a display module according to one or more embodiments of the present disclosure. FIG. 8A illustrates a display module 10-1 in an unfolded state, and FIG. 8B illustrates a display module 10-1_F in a folded state. Also, description of some components is omitted for ease of description.

The display module 10-1 illustrated in FIG. 8A corresponds to the display module 10 (see FIG. 5A) illustrated in FIG. 5A, but may be different with respect to the shape of a second frame FR21. For example, the second frame FR21 may include at least one bent portion when viewed in a plan view.

The second frame FR21 may further include bent portions that bent from the second frame FR2 illustrated in FIG. 5A to the second direction DR2 and extend in the second direction DR2 compared to the second frame FR2 (see FIG. 5A) illustrated in FIG. 5A. That is, the second frame FR21 may have a shape that overlaps the vertical side and at least a portion of the horizontal side of the first frame FR1 when viewed in a plan view.

Referring to FIG. 8B, in the display module 10-1_F in the folded state, the second frame FR21 may be moved and at least partially exposed outward from the first frame FR1. A portion of the second frame FR21 extending in the first direction DR1 may be exposed from the first frame FR1 to define a bezel of the display module 10-1_F in a folded state. The second frame FR21 moves in the second direction DR2, and thus, a portion of the second frame FR21 that extends in the second direction DR2 may remain covered by the first frame FR1.

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and not visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained.

Figure 9A:
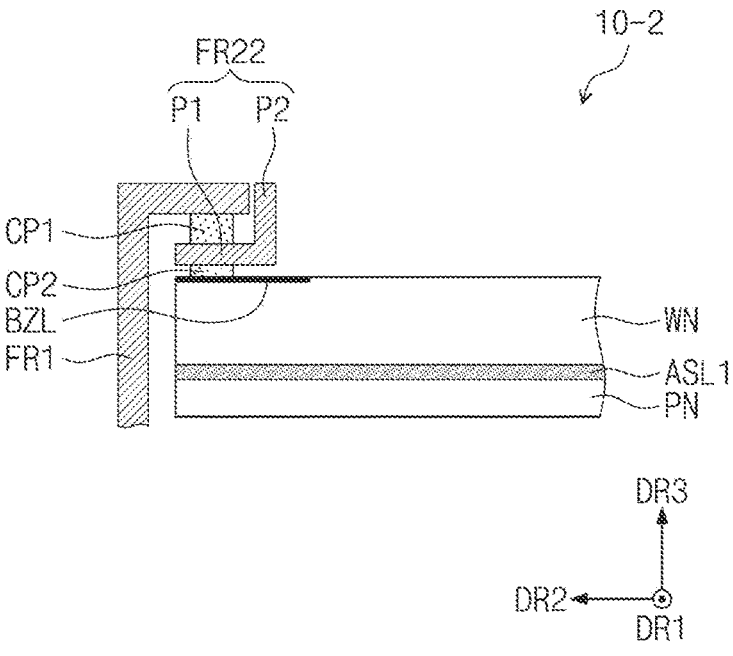
FIGS. 9A and 9B are cross-sectional views of a display module according to one or more embodiments of the present disclosure.
Figure 9B:
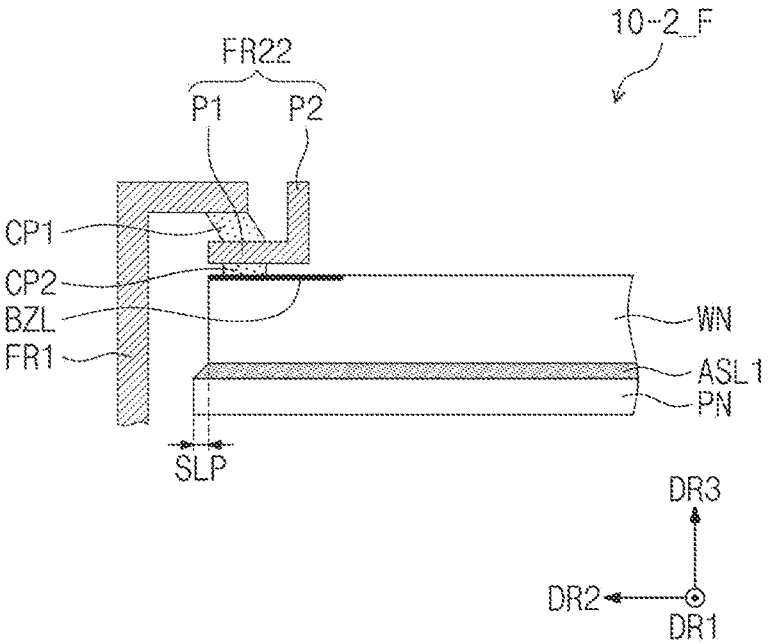

FIGS. 9A and 9B are cross-sectional views of a display module according to one or more embodiments of the present disclosure. FIG. 9A illustrates a display module 10-2 in an unfolded state, and FIG. 9B illustrates a display module 10-2_F in a folded state. FIGS. 9A and 9B may relate to the display modules (10, 10_F) illustrated in FIGS. 6A and 6B except for the shapes of the frames FR1 and/or FR22. Hereinafter, duplicated descriptions will be omitted.

Referring to FIG. 9A, a second frame FR22 may include at least one bent portion. For example, the second frame FR22 may include a horizontal portion P1 and a vertical portion P2. When viewed in a cross-sectional view, the horizontal portion P1 may be parallel to the second direction DR2, and the vertical portion P2 may be parallel to the third direction DR3. The horizontal portion P1 may be associated with the shape of the second frame FR2 (see FIG. 6A) illustrated in FIG. 6A, and the vertical portion P2 may have a shape bent therefrom. The vertical portion P2 may have a shape that is bent from the horizontal portion P1 and surrounds a first coupling member CP1.

Referring to FIG. 9B, in the display module 10-2_F in the folded state, the second frame FR22 may move in a direction that is opposite to the second direction DR2 in response to the movement of the display device 100 including the window WN. Even when the second frame FR22 is moved, the coupling between the first frame FR1 and the second frame FR22 may be stably maintained before and after folding due to the elastic force of the first coupling member CP1.

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and may not be visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained.

In addition, according to one or more embodiments of the present disclosure, the second frame FR22 has a shape that includes the bent portion, and thus, the first coupling member CP1 may not be exposed to the outside in the unfolded state. Accordingly, a space between the first frame FR1 and the second frame FR22 or the first coupling member CP1 may not be visible from the outside, and thus, the display module 10-2 may have an improved aesthetic appearance. In addition, it is possible to reduce or prevent external contaminants from entering the space between the first frame FR1 and the second frame FR22.

Figure 10A:
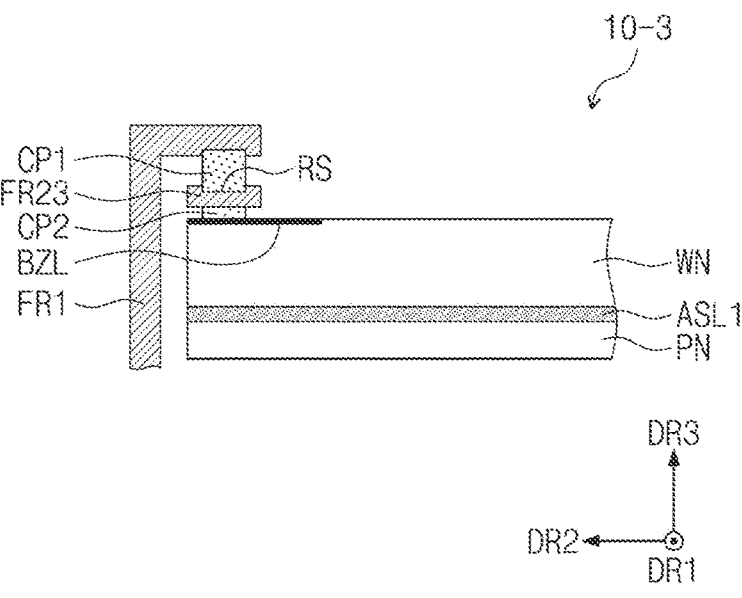
FIGS. 10A and 10B are cross-sectional views of a display module according to one or more embodiments of the present disclosure.
Figure 10B:
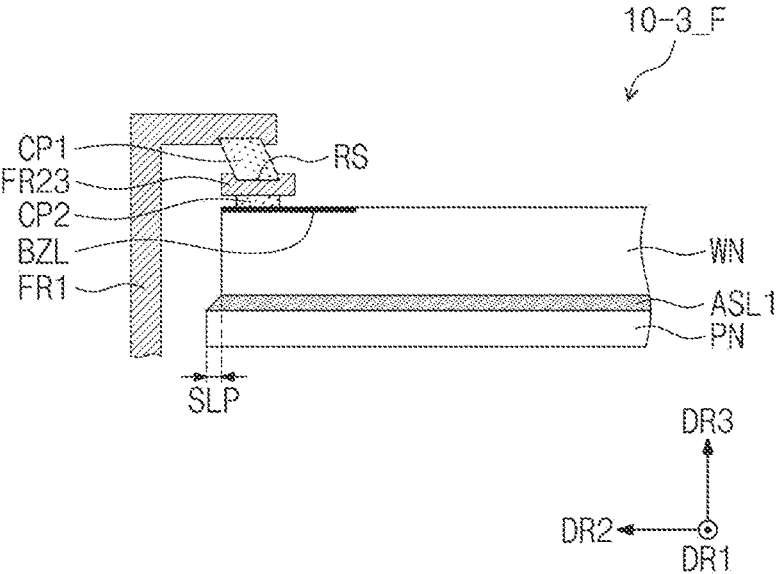

FIGS. 10A and 10B are cross-sectional views of a display module according to one or more embodiments of the present disclosure. FIG. 10A illustrates a display module 10-3 in an unfolded state, and FIG. 10B illustrates a display module 10-3_F in a folded state. FIGS. 10A and 10B may relate to the display modules (10, 10_F) illustrated in FIGS. 6A and 6B except for the shapes of the frames FR1 and/or FR23. Hereinafter, duplicated descriptions will be omitted.

Referring to FIGS. 10A and 10B, a second frame FR23 may include at least one recessed portion RS. For example, the recessed portion RS may be provided on a surface of the second frame FR23 coupled to a first coupling member CP1, and may be recessed in a direction opposite to a third direction DR3.

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and may not be visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained.

Also, according to one or more embodiments of the present disclosure, the second frame FR23 includes the recessed portion RS, and thus, a contact area with the first coupling member CP1 may be increased. Accordingly, the bonding force between the second frame FR23 and the first coupling member CP1 is increased, and thus, it is possible to reduce or prevent the likelihood of defects, such as separation or disengagement between the first coupling member CP1 and the second frame FR23 in the folded state.

Figure 11A:
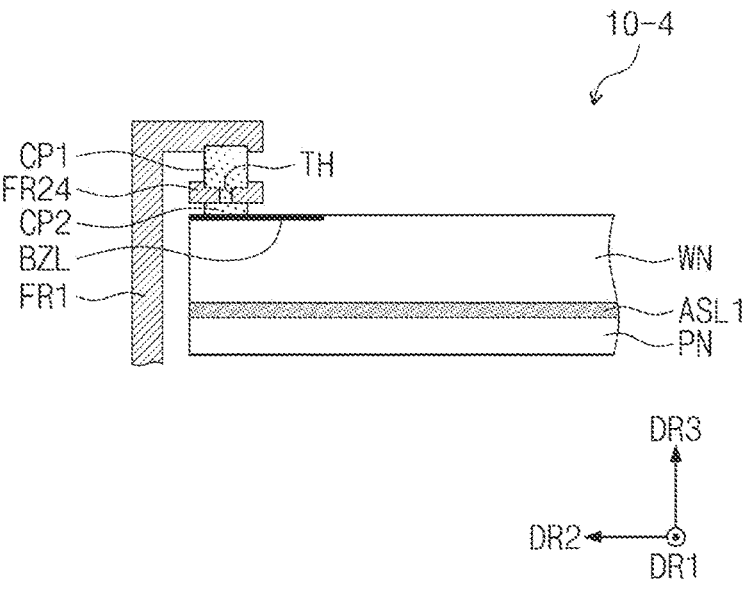
FIGS. 11A and 11B are cross-sectional views of a display module according to one or more embodiments of the present disclosure.
Figure 11B:
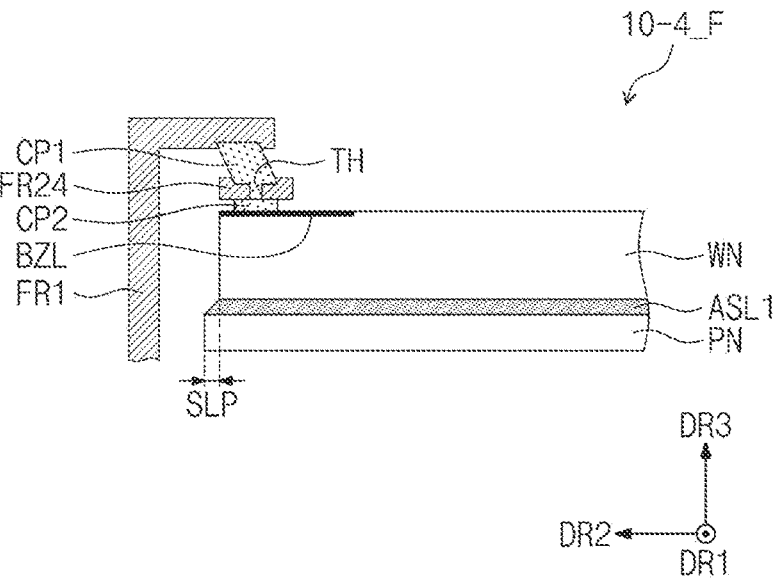

FIGS. 11A and 11B are cross-sectional views of a display module according to one or more embodiments of the present disclosure. FIG. 11A illustrates a display module 10-4 in an unfolded state, and FIG. 11B illustrates a display module 10-4_F in a folded state. FIGS. 11A and 11B may relate to the display modules (10, 10_F) illustrated in FIGS. 6A and 6B except for the shapes of the frames FR1 and/or FR24. Hereinafter, duplicated descriptions will be omitted.

Referring to FIGS. 11A and 11B, a second frame FR24 may include at least one pass-through portion TH. For example, the pass-through portion TH may be provided on a surface of the second frame FR24 coupled to a first coupling member CP1, and may pass therethrough in a third direction DR3.

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and not visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained.

Also, according to one or more embodiments of the present disclosure, the second frame FR24 includes the pass-through portion TH, and thus, a contact area with the first coupling member CP1 may be increased. In addition, the first coupling member CP1 may be connected to a second coupling member CP2 via the pass-through portion TH. Accordingly, the bonding force between the second frame FR24 and the first coupling member CP1 is increased, and thus, it is possible to reduce or prevent the likelihood of defects, such as separation or disengagement between the first coupling member CP1 and the second frame FR24 in the folded state.

Figure 12A:
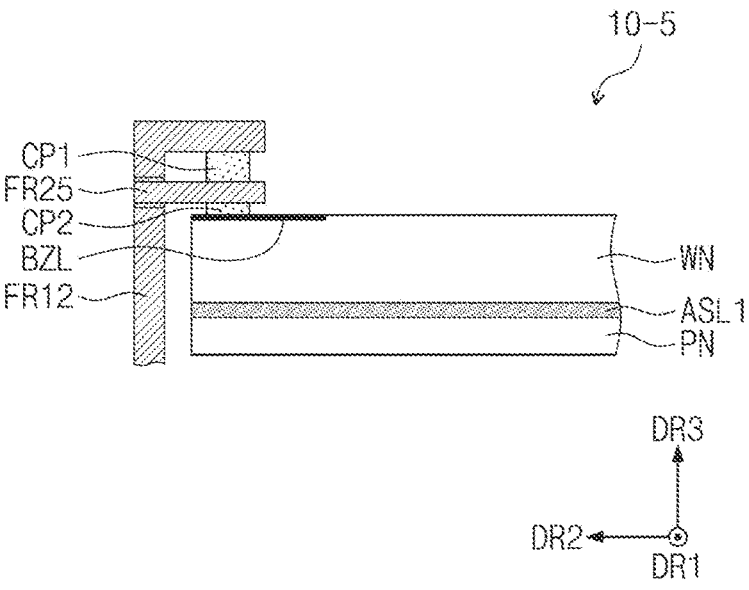
FIGS. 12A to 12D are cross-sectional views of a display module according to one or more embodiments of the present disclosure.
Figure 12B:
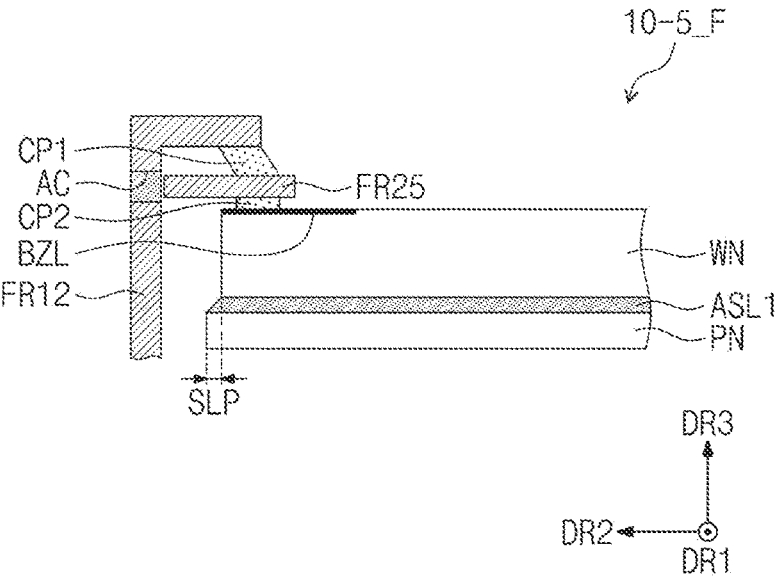
Figure 12C:
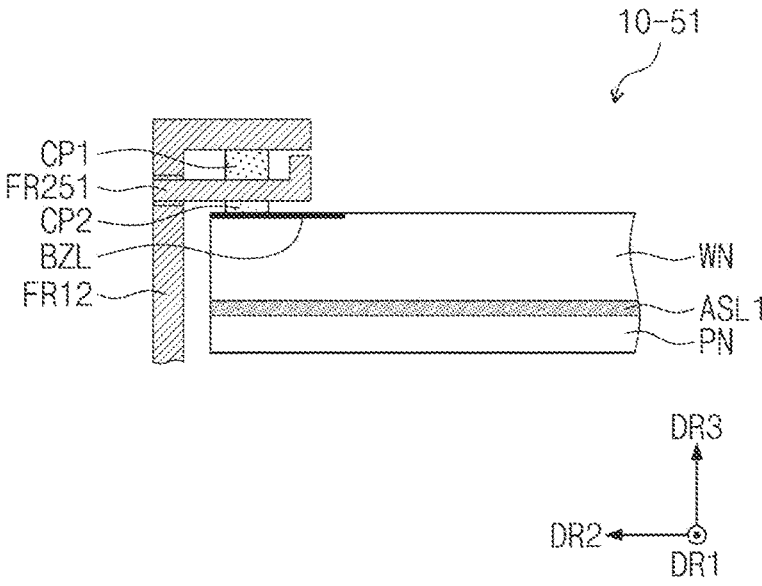
Figure 12D:
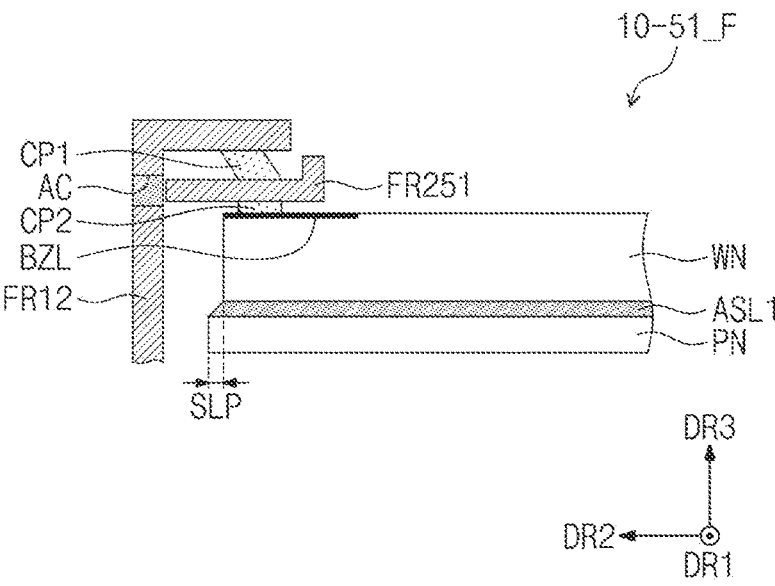

FIGS. 12A to 12D are cross-sectional views of a display module according to one or more embodiments of the present disclosure. FIG. 12A illustrates a display module 10-5 in an unfolded state, and FIG. 12B illustrates a display module 10-5_F in a folded state. FIG. 12C illustrates a display module 10-51 in an unfolded state, and FIG. 12D illustrates a display module 10-51_F in a folded state. FIGS. 12A to 12D may relate to the display modules (10, 10_F) illustrated in FIGS. 6A and 6B except for the shapes of the frames FR12, FR25, and/or FR251. Hereinafter, duplicated descriptions will be omitted.

Referring to FIGS. 12A and 12B, a first frame FR12 may include at least one accommodating portion AC. The accommodating portion AC may be formed on a surface of the first frame FR12 that extends in a third direction DR3. A second frame FR25 may extend in a second direction DR2, and may be inserted into the accommodating portion AC. Also, referring to FIGS. 12C and 12D, a second frame FR251 may further include a bent portion that is bent in a third direction DR3.

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and not visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained.

In addition, according to one or more embodiments of the present disclosure, the first frame FR12 provides the accommodating portion AC, and the second frame FR25 is accommodated in the accommodating portion AC. Accordingly, it is possible to reduce the possibility that the second frame FR25 is visually recognized from the outside in the unfolded state. Furthermore, the first frame FR12 and the second frame FR25 may be coupled to each other by the accommodating portion AC in addition to a first coupling member CP1, and thus, the coupling force between the second frame FR25 and the first frame FR12 is increased. Accordingly, it is possible to reduce or prevent the likelihood of a defect, such as separation of the second frame FR25. Moreover, according to one or more embodiments of the present disclosure, the second frame FR251 further includes the bent portion, and thus, the electronic apparatus may have an improved aesthetic appearance. In addition, it is possible to reduce or prevent external contaminants from entering the space between the frames FR12 and FR251.

Figure 13A:
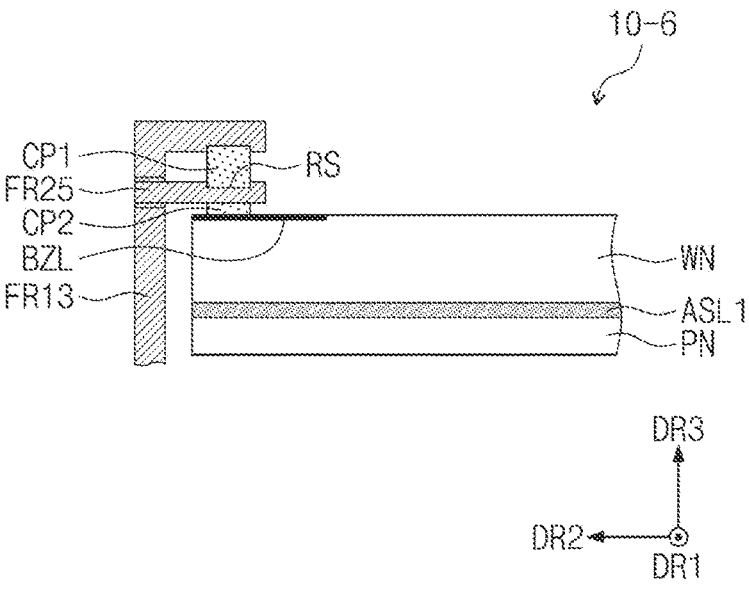
FIGS. 13A and 13B are cross-sectional views of a display module according to one or more embodiments of the present disclosure.
Figure 13B:
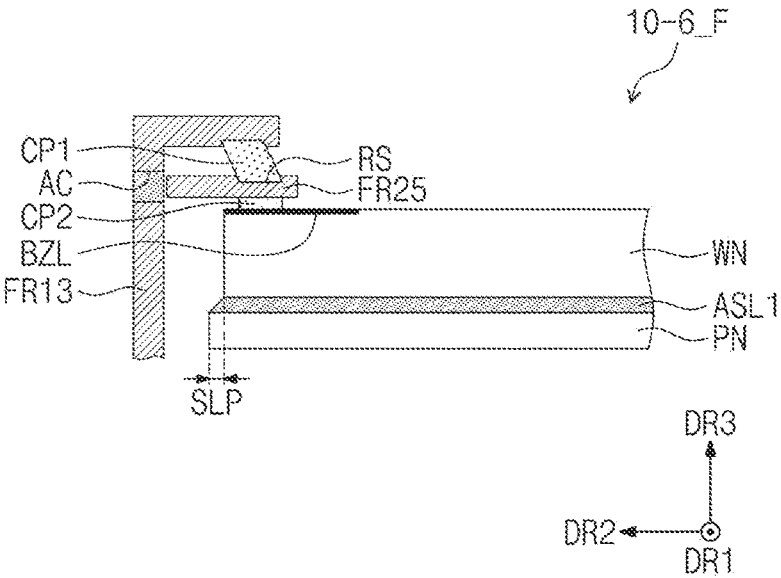

FIGS. 13A and 13B are cross-sectional views of a display module according to one or more embodiments of the present disclosure. FIG. 13A illustrates a display module 10-6 in an unfolded state, and FIG. 13B illustrates a display module 10-6_F in a folded state. FIGS. 13A and 13B may relate to the display modules (10, 10_F) illustrated in FIGS. 6A and 6B except for the shapes of the frames FR13 and FR25. Hereinafter, duplicated descriptions will be omitted.

Referring to FIGS. 13A and 13B, a first frame FR13 may include at least one accommodating portion AC. A second frame FR25 may extend in a second direction DR2, and may be inserted into the accommodating portion AC. Also, the second frame FR25 may include a recessed portion RS provided on a surface coupled to a first coupling member CP1.

According to one or more embodiments of the present disclosure, the shape and area of the bezel region may be changed depending on whether or not folding occurs. A narrow bezel region is maintained in the unfolded state, and a wide bezel region is provided in the folded state. Accordingly, even if the slip section SLP is formed in the display device 100 due to folding, the slip section SLP may be stably covered and not visible from the outside. Therefore, even though the absolute size of the bezel is not increased to cope with the occurrence of the slip section SLP, the slip section SLP formed during folding may be stably covered. Accordingly, a foldable display having a slim bezel may be suitably obtained. In addition, according to one or more embodiments of the present disclosure, the coupling force between the first frame FR13 and the second frame FR25 is increased, and thus, it is possible to reduce or prevent the likelihood of a defect, such as separation of the second frame FR25.

According to one or more embodiments of the present disclosure, the bezel may be changed depending on whether folded or unfolded, and thus, a slim bezel may be provided even for a foldable display device. According to one or more embodiments of the present disclosure, the foldable display device may have the improved aesthetic appearance.

Although the present disclosure has been described with reference to the embodiments, it will be understood that various changes and modifications of the present disclosure may be made by one ordinary skilled in the art or one having ordinary knowledge in the art without departing from the spirit and technical field of the disclosure as hereinafter claimed. Accordingly, the technical scope of the disclosure should not be limited by the foregoing description, but rather should be defined only by the following claims, with functional equivalents thereof to be included therein.

What is claimed is:
1. A display device comprising:
a display panel configured to be folded about a folding axis extending in a first direction;
a window above the display panel;
an adhesive member between the window and the display panel;
a first frame covering an edge of the display panel and an edge of the window;
a second frame between the first frame and the window; and
a coupling member above the window, between the first frame and the second frame in a third direction crossing the first direction, the third direction being a thickness direction of the window, having elasticity, and coupling the first frame to the second frame,
wherein the first frame corresponds to a first bezel region in an unfolded state in which the display panel is unfolded, and
wherein the first frame and the second frame correspond to a second bezel region, which is different from the first bezel region, in a folded state in which the display panel is folded.

2. The display device of claim 1, wherein an overlapping area between the first frame and the second frame in a plan view in the unfolded state is different from an overlapping area between the first frame and the second frame in the plan view in the folded state.

3. The display device of claim 2, wherein a portion of the second frame overlaps the first frame in the plan view in the unfolded state, and does not overlap the first frame in the plan view in the folded state.

4. The display device of claim 3, wherein the coupling member has different respective shapes in the unfolded and folded states.

5. The display device of claim 4, wherein the adhesive member has different respective shapes in the unfolded and folded states.

6. The display device of claim 1, wherein the second frame extends in the first direction, and comprises a bar-shaped portion.

7. The display device of claim 6, wherein the second frame further comprises a bent portion that is bent from the bar-shaped portion, and that is parallel to the third direction.

8. The display device of claim 7, wherein the bent portion is spaced apart from the coupling member in a second direction crossing the first direction and the third direction.

9. The display device of claim 7, wherein an overlapping area between the first frame and the bent portion in the folded state is substantially equal to an overlapping area between the first frame and the bent portion in the unfolded state.

10. A display device comprising:
a display panel configured to be folded about a folding axis extending in a first direction;
a window above the display panel;
an adhesive member between the window and the display panel;
a first frame covering an edge of the display panel and an edge of the window;
a second frame between the first frame and the window;
a coupling member between the first frame and the second frame, having elasticity, and coupling the first frame to the second frame; and
an additional coupling member between the second frame and the window, having elasticity that is less than or equal to the elasticity of the coupling member, and coupling the second frame to the window,
wherein the first frame corresponds to a first bezel region in an unfolded state in which the display panel is unfolded, and
wherein the first frame and the second frame correspond to a second bezel region, which is different from the first bezel region, in a folded state in which the display panel is folded.

11. The display device of claim 10, wherein the additional coupling member contacts an upper surface of the window.

12. The display device of claim 10, wherein the second frame defines a recessed portion for receiving the coupling member therein.

13. The display device of claim 10, wherein the second frame defines a pass-through portion therethrough, and
wherein the coupling member contacts the additional coupling member via the pass-through portion.

14. The display device of claim 10, wherein the first frame defines an accommodating portion for accommodating a portion of the second frame therein in the unfolded state, and
wherein the second frame is removed from the accommodating portion in the folded state.

15. An electronic device comprising:
a display panel configured to be folded about a folding axis extending in a first direction;
a window above the display panel;
an adhesive member between the window and the display panel; and
a frame covering a portion of the display panel, and providing a first bezel region in an unfolded state in which the display panel is unfolded, and a second bezel region, which is different from the first bezel region, in a folded state in which the display panel is folded, the frame comprising:
a first frame covering an edge of the display panel and an edge of the window;
a second frame between the first frame and the window in a third direction crossing the first direction, the third direction being a thickness direction of the window; and
a coupling member above the window, between the first frame and the second frame, and coupling the first frame to the second frame,
wherein each of the first bezel region and the second bezel region corresponds to a region onto which the first frame and the second frame are projected in a plan view.

16. The electronic device of claim 15, wherein the coupling member has elasticity.

17. The electronic device of claim 16, wherein the coupling member comprises:
a first coupling member between the first frame and the second frame; and
a second coupling member between the second frame and the window, having elasticity that is less than or equal to the elasticity of the first coupling member, and coupling the second frame to the window.

18. The electronic device of claim 17, wherein the second coupling member has a substantially same shape in the folded and unfolded states.

19. The electronic device of claim 15, wherein the second bezel region has a larger area than the first bezel region.

20. The electronic device of claim 19, wherein a region of the second bezel region that extends in a second direction crossing the folding axis is substantially equal to a region of the first bezel region that extends in the second direction, and
wherein a region of the second bezel region that extends in the first direction has a larger area than a region of the first bezel region that extends in the first direction.

* * * * *